US012672452B2

(12) United States Patent
Park et al.

(10) Patent No.: US 12,672,452 B2
(45) Date of Patent: Jun. 30, 2026

(54) DISPLAY DEVICE

(71) Applicant: Samsung Display Co., LTD., Yongin-si (KR)

(72) Inventors: Joon Yong Park, Yongin-si (KR); Hyun Eok Shin, Yongin-si (KR); Su Kyoung Yang, Yongin-si (KR); Dong Min Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 379 days.

(21) Appl. No.: 18/543,745

(22) Filed: Dec. 18, 2023

(65) Prior Publication Data

US 2024/0389418 A1 Nov. 21, 2024

(30) Foreign Application Priority Data

May 16, 2023 (KR) ........................ 10-2023-0062844

(51) Int. Cl.
| | |
|---|---|
| *H10K 59/00* | (2023.01) |
| *H10K 59/122* | (2023.01) |
| *H10K 59/131* | (2023.01) |
| *H10K 59/80* | (2023.01) |
| *H10K 102/00* | (2023.01) |
| *H10K 102/10* | (2023.01) |

(52) U.S. Cl.
CPC ....... *H10K 59/1315* (2023.02); *H10K 59/122* (2023.02); *H10K 59/873* (2023.02); *H10K 2102/101* (2023.02); *H10K 2102/351* (2023.02)

(58) Field of Classification Search
CPC .. H10K 59/121; H10K 59/122; H10K 59/131; H10K 59/1315; H10K 59/80516; H10K 59/80522; H10K 59/873
See application file for complete search history.

(56) References Cited

U.S. PATENT DOCUMENTS

| | | |
|---|---|---|
| 7,270,894 B2 | 9/2007 | Liu et al. |
| 11,348,983 B1 | 5/2022 | Choung et al. |

(Continued)

FOREIGN PATENT DOCUMENTS

| | | |
|---|---|---|
| CN | 113471384 A | 10/2021 |
| JP | 6248288 B2 | 12/2017 |
| KR | 1020250027384 A | 2/2025 |

*Primary Examiner* — Reema Patel
(74) *Attorney, Agent, or Firm* — CANTOR COLBURN LLP

(57) ABSTRACT

A display device includes a substrate; a first pixel electrode disposed on the substrate; a pixel defining layer disposed on the substrate and defining a first opening overlapping the first pixel electrode; a bank structure disposed on the pixel defining layer and defining a second opening overlapping the first opening; a first light emitting layer disposed on the first pixel electrode and in the first opening; a first common electrode disposed on the first light emitting layer and in contact with the bank structure in the second opening; a first auxiliary electrode disposed on the first common electrode, completely covering the first common electrode in the second opening, and in contact with the bank structure; a second auxiliary electrode disposed on the first auxiliary electrode, completely covering the first auxiliary electrode in the second opening, and in contact with the bank structure; and a first encapsulation layer.

20 Claims, 10 Drawing Sheets

(56)                          References Cited

U.S. PATENT DOCUMENTS

2014/0183501 A1*    7/2014   Kim ..................... H10K 59/122
                                                      438/34
2025/0063919 A1      2/2025   Lee et al.

* cited by examiner

DISPLAY DEVICE

CROSS-REFERENCE TO RELATED APPLICATION

This application claims priority to Korean Patent Application No. 10-2023-0062844, filed on May 16, 2023, and all the benefits accruing therefrom under 35 U.S.C. § 119, the content of which in its entirety is herein incorporated by reference.

BACKGROUND

1. Technical Field

The present disclosure relates to a display device.

2. Description of the Related Art

With the advancement of the information age, the demand for display devices of various forms for displaying an image has increased. For example, display devices have been applied to various electronic devices such as, for example, a smart phone, a digital camera, a laptop computer, a navigation device, or a smart television. A display device may be a flat panel display device such as, for example, a liquid crystal display device, a field emission display device, or an organic light emitting display device. Among flat panel display devices, a light emitting display device may include a light emitting element in which each of pixels of a display panel may be capable of self-emitting light, thereby displaying an image even without a backlight unit for providing the display panel with light.

SUMMARY

Aspects of the present disclosure provide a display device with reduced electrical resistance and improved moisture and oxygen permeability.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

An embodiment of a display device includes a substrate; a first pixel electrode disposed on the substrate; a pixel defining layer disposed on the substrate and defining a first opening overlapping the first pixel electrode; a bank structure disposed on the pixel defining layer and defining a second opening overlapping the first opening; a first light emitting layer disposed on the first pixel electrode and in the first opening; a first common electrode disposed on the first light emitting layer and in contact with the bank structure in the second opening; a first auxiliary electrode disposed on the first common electrode, completely covering the first common electrode in the second opening, and in contact with the bank structure; a second auxiliary electrode disposed on the first auxiliary electrode, completely covering the first auxiliary electrode in the second opening, and in contact with the bank structure; and a first encapsulation layer disposed on the second auxiliary electrode and the bank structure, wherein the bank structure includes a first bank layer disposed on the pixel defining layer and including a conductive material; and a second bank layer disposed on the first bank layer and including a tip protruding more than a side surface of the first bank layer toward the first opening, wherein the second auxiliary electrode is in contact with the second bank layer, and wherein the first auxiliary electrode may be spaced apart from the second bank layer.

In an embodiment, the side surface of the first bank layer may include a first portion in contact with the first common electrode; a second portion in contact with the first auxiliary electrode; and a third portion in contact with the second auxiliary electrode, wherein the second portion is positioned between the first portion and the third portion, and wherein areas of the first portion, the second portion and the third portion may be different.

In an embodiment, the area of the second portion where the first auxiliary electrode is in contact with the side surface of the first bank layer may be greater than the area of the first portion where the first common electrode is in contact with the side surface of the first bank layer.

In an embodiment, the area of the second portion where the first auxiliary electrode is in contact with the side surface of the first bank layer may be greater than the area of the third portion where the second auxiliary electrode is in contact with the side surface of the first bank layer.

In an embodiment, the display device may further include a capping layer completely covering the second auxiliary electrode in the first opening, wherein the capping layer exposes a portion of the second auxiliary electrode in the second opening.

In an embodiment, an exposed portion of the second auxiliary electrode not covered by the capping layer in the second opening may be in contact with the first encapsulation layer.

In an embodiment, a thickness of the first auxiliary electrode in a direction perpendicular to a first direction may be different from a thickness of the second auxiliary electrode, and the thickness of the first auxiliary electrode in the direction perpendicular to the first direction may be smaller than the thickness of the second auxiliary electrode.

In an embodiment, the first auxiliary electrode may include silver alloy, and wherein the second auxiliary electrode may include a transparent conductive oxide.

In an embodiment, the first auxiliary electrode may further include palladium and copper.

In an embodiment, a thickness of the first auxiliary electrode in a direction perpendicular to the first direction may be 30 Å or more and 50 Å or less.

In an embodiment, a thickness of the second auxiliary electrode in a direction perpendicular to the first direction may be 500 Å or more and 700 Å or less.

In an embodiment, the display device may further include a first organic pattern disposed on the second bank layer of the bank structure and surrounding the first opening, wherein the first organic pattern includes a same material as the first light emitting layer; and a first electrode pattern disposed on the first organic pattern and surrounding the first opening, wherein the first electrode pattern includes a same material as the first common electrode, wherein the first organic pattern may overlap the protruding tip of the second bank layer and be spaced apart from the first light emitting layer, and wherein the first electrode pattern may overlap the protruding tip of the second bank layer and be spaced apart from the first common electrode.

In an embodiment, the display device may further include a first auxiliary pattern disposed on the first electrode pattern and surrounding the first opening, wherein the first auxiliary pattern includes a same material as the first auxiliary electrode; and a second auxiliary pattern disposed on the first auxiliary pattern and surrounding the first opening, wherein the second auxiliary pattern includes a same material as the second auxiliary electrode, wherein the first auxiliary pattern may overlap the protruding tip of the second bank layer and be spaced apart from the first auxiliary electrode, and wherein the second auxiliary pattern may overlap the protruding tip of the second bank layer and be spaced apart from the second auxiliary electrode.

In an embodiment, the second bank layer may further include a first surface disposed facing the first bank layer, wherein the second auxiliary electrode and the second auxiliary pattern are in contact with the first surface of the second bank layer, and wherein the second auxiliary electrode and the second auxiliary pattern in contact with the first surface of the second bank layer may be spaced apart from each other.

In an embodiment, the second bank layer and the first encapsulation layer may be in contact with each other at a region between the second auxiliary pattern and the second auxiliary electrode on the first surface of the second bank layer.

In an embodiment, the display device may further include a capping pattern disposed in the area overlapping the second opening, wherein the capping pattern at least partially covers the second auxiliary pattern, wherein the capping pattern partially may at least partially expose the second auxiliary pattern in the area overlapping the second opening, and wherein a portion of the second auxiliary pattern partially exposed by the capping pattern may be in contact with the first encapsulation layer.

In an embodiment, the display device may further include a second pixel electrode spaced apart from the first pixel electrode, wherein the pixel defining layer may be interposed between the first pixel electrode and the second pixel electrode; a second light emitting layer disposed on the second pixel electrode; a second common electrode disposed on the second light emitting layer; a third auxiliary electrode disposed on the second common electrode; and a fourth auxiliary electrode disposed on the third auxiliary electrode, wherein the first encapsulation layer further includes: a first inorganic layer covering the second auxiliary electrode; and a second inorganic layer covering the fourth auxiliary electrode, wherein the first inorganic layer and the second inorganic layer may be disposed to be spaced apart from each other.

In an embodiment, the display device may further include a second encapsulation layer disposed on the first encapsulation layer, wherein, in a region where the first inorganic layer and the second inorganic layer included in the first encapsulation layer may be spaced apart, the second encapsulation layer and the second bank layer of the bank structure are in contact with each other.

An embodiment of a display device includes a substrate; a first pixel electrode disposed on the substrate; a pixel defining layer disposed on the substrate and defining a first opening overlapping the first pixel electrode; a bank structure disposed on the pixel defining layer and defining a second opening overlapping the first opening; a first light emitting layer disposed on the first pixel electrode and in the first opening; a first common electrode disposed on the first light emitting layer and in contact with the bank structure in the second opening; a first auxiliary electrode disposed on the first common electrode, completely covering the first common electrode in the second opening, and in contact with the bank structure; a second auxiliary electrode disposed on the first auxiliary electrode, completely covering the first auxiliary electrode in the second opening, and in contact with the bank structure; a first electrode pattern disposed on the bank structure, wherein the first electrode pattern surrounds the first opening and is spaced apart from the first common electrode; a first auxiliary pattern completely covering the first electrode pattern and spaced apart from the first auxiliary electrode in an area overlapping the second opening; a second auxiliary pattern completely covering the first auxiliary pattern and spaced apart from the second auxiliary electrode in the area overlapping the second opening; and an encapsulation layer completely covering the second auxiliary electrode and the second auxiliary pattern in the area overlapping the second opening, wherein the bank structure may include a first bank layer disposed on the pixel defining layer and including a conductive material; and a second bank layer disposed on the first bank layer and including a tip where a side surface of the second bank layer protrudes more than a side surface of the first bank layer toward the first opening, wherein the second auxiliary pattern includes a first surface overlapping the second opening and covering the side surface of the second bank layer and a second surface covering a surface of the second bank layer facing the first bank layer.

In an embodiment, the second auxiliary electrode extends to a boundary surface where the first bank layer and the second bank layer may be in contact with each other, wherein the second auxiliary pattern further includes a third surface in contact with the surface of the second bank layer facing the first bank layer, and wherein the second surface of the second auxiliary pattern covering the surface of the second bank layer and the third surface of the second auxiliary electrode in contact with the surface of the second bank layer may be spaced apart from each other.

In the display device according to embodiments of the present disclosure, electrical resistance can be reduced and luminance can be improved.

In the display device according to embodiments of the present disclosure, moisture and oxygen permeability can be reduced, and luminance can be improved.

However, effects according to the embodiments of the present disclosure are not limited to those exemplified above and various other effects are incorporated herein.

BRIEF DESCRIPTION OF THE DRAWINGS

The above and other aspects and features of the present disclosure will become more apparent by describing in detail example embodiments thereof with reference to the attached drawings, in which:

FIG. 6 is a cross-sectional view taken along line X1-X1' of FIG. 5;

FIG. 9 is an enlarged cross-sectional view of area 'C' of FIG. 7; and

DETAILED DESCRIPTION

Figure 1:
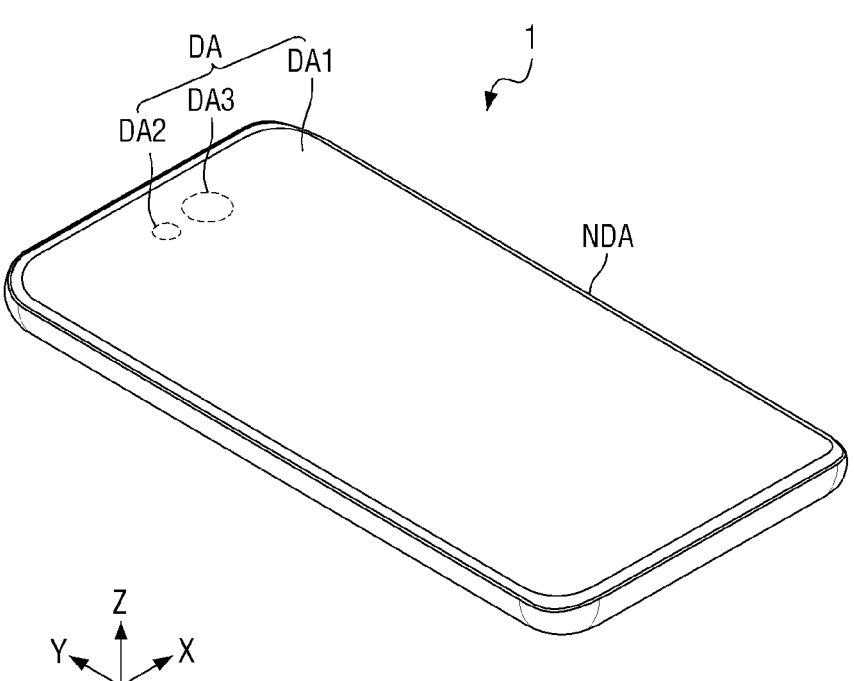
FIG. 1 is a schematic perspective view illustrating an electronic device according to an embodiment.

The invention will now be described more fully herein-after with reference to the accompanying drawings, in which various embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used diction-aries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of ide-alized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illus-trated or described as flat may, typically, have rough and/or nonlinear features. Moreover, sharp angles that are illus-trated may be rounded. Thus, the regions illustrated in the figures are schematic in nature and their shapes are not intended to illustrate the precise shape of a region and are not intended to limit the scope of the claims.

Hereinafter, embodiments of the disclosure will be described with reference to the accompanying drawings.

FIG. 1 is a schematic perspective view illustrating an electronic according to an embodiment.

Referring to FIG. 1, an electronic device 1 may display a moving image or a still image. The electronic device 1 may refer to all suitable electronic devices including a display screen. For example, electronic device 1 may be or include a television, a laptop computer, a monitor, an advertising board, an Internet-of-Things device, a mobile phone, a smart phone, a tablet personal computer (PC), an electronic watch, a smart watch, a watch phone, a head mounted display, a mobile communication terminal, an electronic diary, an electronic book, a portable multimedia player (PMP), a navigator, a game machine, a digital camera, a camcorder and the like.

The electronic device 1 may include a display device 10 (see FIG. 2) for providing a display screen. Examples of the display device include an inorganic light emitting diode display device, an organic light emitting display device, a quantum dot light emitting display device, a plasma display device and a field emission display device. In the examples described herein, an organic light emitting diode display device is applied as an example of the display device, but the example of the display device is not limited to the organic light emitting diode display device, and another display device may be applied with the same technical spirits are applicable thereto.

Various modifications may be made to a shape of the electronic device 1. For example, the electronic device 1 may have a rectangular shape that is long in a horizontal direction, a rectangular shape that is long in a vertical direction, a square shape, a square shape with rounded corners (vertexes), other polygonal shapes, a circular shape, and the like. A shape of a display area DA of the electronic device 1 may be also similar to the overall shape of the electronic device 1. An electronic device 1 of a rectangular shape that is longer in a second direction Y is illustrated in FIG. 1.

The electronic device 1 may include a display area DA and a non-display area NDA. The display area DA is an area in which a screen may be displayed, and the non-display area NDA is an area in which a screen is not displayed. The display area DA may be referred to as an active area, and the non-display area NDA may be referred to as a non-active area. The display area DPA may generally occupy the center of the electronic device 1.

The display area DA may include a first display area DA1, a second display area DA2, and a third display area DA3. The second display area DA2 and the third display area DA3 are areas in which components for adding various functions to the electronic device 1 are disposed, and may correspond to component areas.

Figure 2:
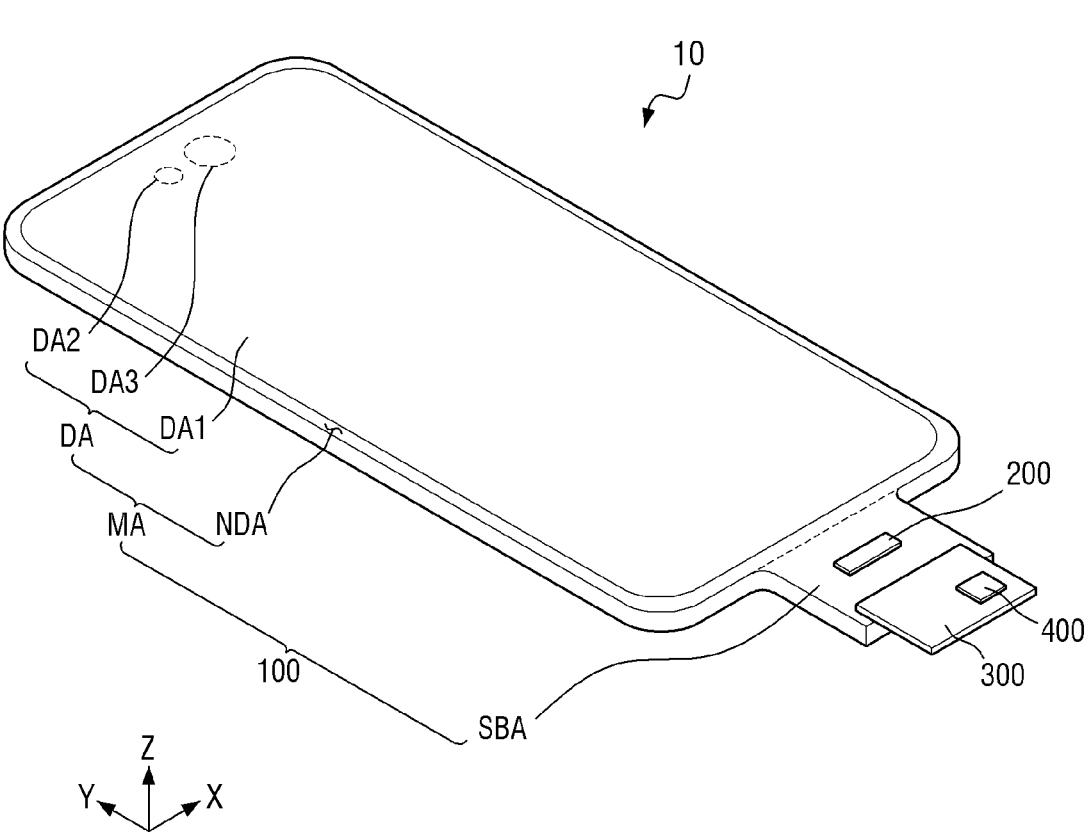
FIG. 2 is a perspective view illustrating a display device included in an electronic device according to an embodiment.

FIG. 2 is a perspective view illustrating a display device 10 included in an electronic device 1 according to an embodiment.

Referring to FIG. 2, the electronic device 1 according to an embodiment may include a display device 10. The display device 10 may provide a screen displayed by the electronic device 1. The display device 10 may have a planar shape similar to a planar shape of the electronic device 1. For example, the display device 10 may have a shape similar to a rectangular shape having a short side in a first direction X and a long side in a second direction Y. A corner at which the short side in the first direction X and the long side in the second direction Y meet may be rounded to have a curvature, but is not limited thereto, and may be formed to have a right angle. The planar shape of the display device 10 is not limited to a quadrangle and may be formed to be similar to other polygonal shapes, a circular shape or an elliptical shape.

The display device 10 may include a display panel 100, a display driver 200, a circuit board 300 and a touch driver 400.

The display panel 100 may include a main area MA and a sub-area SBA.

The main area MA may include a display area DA including pixels for displaying an image, and a non-display area NDA disposed near the display area DA. The display area DA may include a first display area DA1, a second display area DA2 and a third display area DA3. The display area DA may emit light from a plurality of light emission areas or a plurality of opening areas. For example, the display panel 100 may include a pixel circuit including switching elements, a pixel defining layer defining a light emission area or an opening area, and a self-light emitting element.

For example, the self-light emitting element may include at least one of an organic light emitting diode including an organic light emitting layer, a quantum dot light emitting diode (LED) including a quantum dot light emitting layer, an inorganic LED including an inorganic semiconductor or a micro LED.

The non-display area NDA may be an outer area of the display area DA. The non-display area NDA may be defined as an edge area of the main area MA of the display panel 100. The non-display area NDA may include a gate driver (not shown) for supplying gate signals to gate lines and fan-out lines (not shown) connecting the display driver 200 with the display area DA.

The sub-area SBA may be an area extended from one side of the main area MA. The sub-area SBA may include a flexible material capable of being subjected to bending, folding, rolling or the like. For example, when the sub-area SBA is bent, the sub-area SBA may overlap the main area MA in a thickness direction (a third direction Z). The sub-area SBA may include a display driver 200 and a pad portion connected to the circuit board 300. In another embodiment, the sub-area SBA may be omitted, and the display driver 200 and the pad portion may be disposed in the non-display area NDA.

The display driver 200 may output signals and voltages for driving the display panel 100. The display driver 200 may supply data voltages to data lines. The display driver 200 supplies a power voltage to a power line and supplies a gate control signal to the gate driver. The display driver 200 may be formed of an integrated circuit IC and then packaged on the display panel 100 by a Chip On Glass (COG) method, a Chip On Plastic (COP) method or an ultrasonic bonding method. For example, the display driver 200 may be disposed in the sub-area SBA, and may overlap the main area MA in the thickness direction by bending of the sub-area SBA. In another example, the display driver 200 may be packaged on the circuit board 300.

The circuit board 300 may be attached to the pad portion of the display panel 100 by an anisotropic conductive film (ACF). Lead lines of the circuit board 300 may be electrically connected to the pad portion of the display panel 100. The circuit board 300 may be formed of a flexible film and may be, for example, a flexible printed circuit board, a printed circuit board or a chip on film.

The touch driver 400 may be packaged on the circuit board 300. The touch driver 400 may be connected to a touch sensor of the display panel 100. The touch driver 400 may supply a touch driving signal to a plurality of touch electrodes of the touch sensor and sense a change amount of capacitance between the plurality of touch electrodes. For example, the touch driving signal may be a pulse signal having a predetermined frequency. The touch driver 400 may calculate whether input is performed and input coordinates based on the change amount in capacitance between the plurality of touch electrodes. The touch driver 400 may be formed as an integrated circuit (IC).

Figure 3:
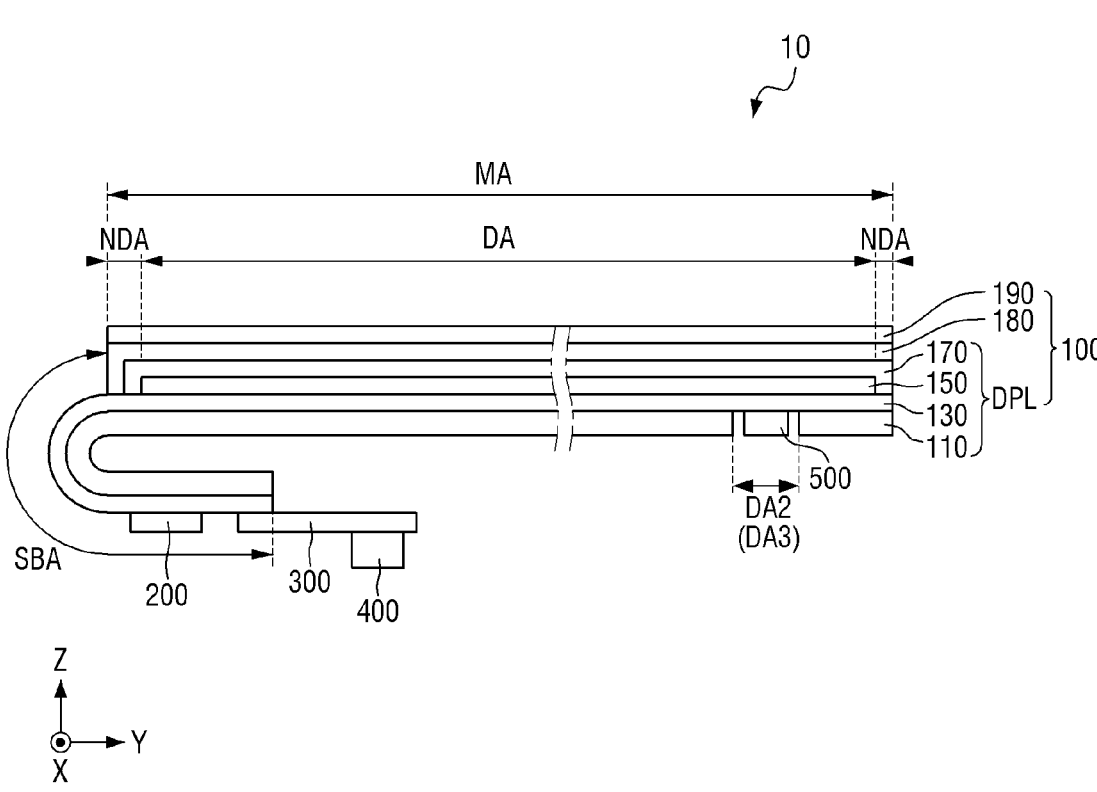
FIG. 3 is a cross-sectional view illustrating that the display device of FIG. 2 is viewed from a side.

FIG. 3 is a cross-sectional view illustrating the display device 10 of FIG. 2, viewed from a side of the display device 10.

Referring to FIG. 3, the display panel 100 may include a display layer DPL, a touch sensing layer 180, and a color filter layer 190. In addition, the display layer DPL may include a substrate 110, a thin film transistor layer 130, a light emitting element layer 150, and a thin film encapsulation layer 170.

The substrate 110 may be a base substrate or a base member. The substrate 110 may be a flexible substrate capable of being subjected to bending, folding, rolling or the like. For example, the substrate 110 may include a polymer resin such as, for example, polyimide (PI), but is not limited thereto. For another example, the substrate 110 may include a glass material or a metal material.

The thin film transistor layer 130 may be disposed on the substrate 110. The thin film transistor layer 130 may include a plurality of thin film transistors constituting a pixel circuit of pixels. The thin film transistor layer 130 may further include gate lines, data lines, power lines, gate control lines, fan-out lines for connecting the display driver 200 with the data lines, and lead lines for connecting the display driver 200 with the pad portion. Each of the thin film transistors may include a semiconductor area, a source area, a drain electrode, and a gate electrode. For example, when the gate driver is formed on one side of the non-display area NDA of the display panel 100, the gate driver may include thin film transistors.

The thin film transistor layer 130 may be disposed in the display area DA, the non-display area NDA, and the sub-area SBA. The thin film transistors, the gate lines, the data lines and the power lines of respective pixels of the thin film transistor layer 130 may be disposed in the display area DA. The gate control lines and fan-out lines of the thin film transistor layer 130 may be disposed in the non-display area NDA. The lead lines of the thin film transistor layer 130 may be disposed in the sub-area SBA.

The light emitting element layer 150 may be disposed on the thin film transistor layer 130. The light emitting element layer 150 may include a plurality of light emitting elements that include a first electrode, a second electrode and a light emitting layer to emit light, and a pixel defining layer that defines pixels. The plurality of light emitting elements of the light emitting element layer 150 may be disposed in the display area DA.

In an embodiment, the light emitting layer may be an organic light emitting layer that includes an organic material. The light emitting layer may include a hole transporting layer, an organic light emitting layer, and an electron transporting layer. When the first electrode receives a voltage through the thin film transistor of the thin film transistor layer 130 and the second electrode receives a cathode voltage, holes and electrons may move to the organic light emitting layer through the hole transporting layer and the electron transporting layer, respectively, and may combine with each other in the organic light emitting layer to emit light.

In another embodiment, the light emitting element may include a quantum dot light emitting diode including a quantum dot light emitting layer, an inorganic light emitting diode including an inorganic semiconductor, or a micro light emitting diode.

The thin film encapsulation layer 170 may cover an upper surface and sides of the light emitting element layer 150 and protect the light emitting element layer 150. The thin film encapsulation layer 170 may include at least one inorganic layer and at least one organic layer to encapsulate the light emitting element layer 150.

The touch sensing layer 180 may be disposed on the thin film encapsulation layer 170. The touch sensing layer 180 may include a plurality of touch electrodes for sensing a user's touch in a capacitive manner and touch lines connecting the touch electrodes and the touch driver 400. For example, the touch sensing layer 180 may sense a user's touch in a mutual capacitance manner or a self-capacitance manner.

In an embodiment, the touch sensing layer 180 may be disposed on a separate substrate disposed on the display layer DPL. In this case, the substrate that supports the touch sensing layer 180 may be a base member that encapsulates the display layer DPL.

The touch electrodes of the touch sensing layer 180 may be disposed in a touch sensor area overlapping the display area DA. The touch lines of the touch sensing layer 180 may be disposed in a touch peripheral area overlapping the non-display area NDA.

In some embodiments, the display device 10 may further include an optical device 500. The optical device 500 may be disposed in the second display area DA2 or the third display area DA3. The optical device 500 may emit or receive light in an infrared, ultraviolet, or visible light band. For example, the optical device 500 may be an optical sensor capable of sensing light incident on the display device 10. The optical sensor may be, for example, a proximity sensor, an illuminance sensor, a camera sensor or an image sensor.

The color filter layer 190 may overlap the emission area to be disposed on the thin-film encapsulation layer 170 (e.g., such that the color filter layer 190 is disposed on the thin-film encapsulation layer 170). The color filter layer 190 may include a plurality of color filters corresponding to a plurality of emission areas, respectively. Each of the color filters may selectively transmit light of a specific wavelength and block or absorb light of other wavelengths. The color filter layer 190 may absorb a portion of light introduced from the outside of the display device 10 to reduce the amount of reflected light due to the external light. Therefore, the color filter layer 190 can prevent color distortion due to reflection of the external light.

In the example implementation illustrated at FIG. 3, the color filter layer 190 is directly disposed on the thin-film encapsulation layer 170, and the display device 10 may be implemented without a separate substrate for the color filter layer 190. Therefore, the thickness of the display device 10 may be relatively small compared to other display devices.

Figure 4:
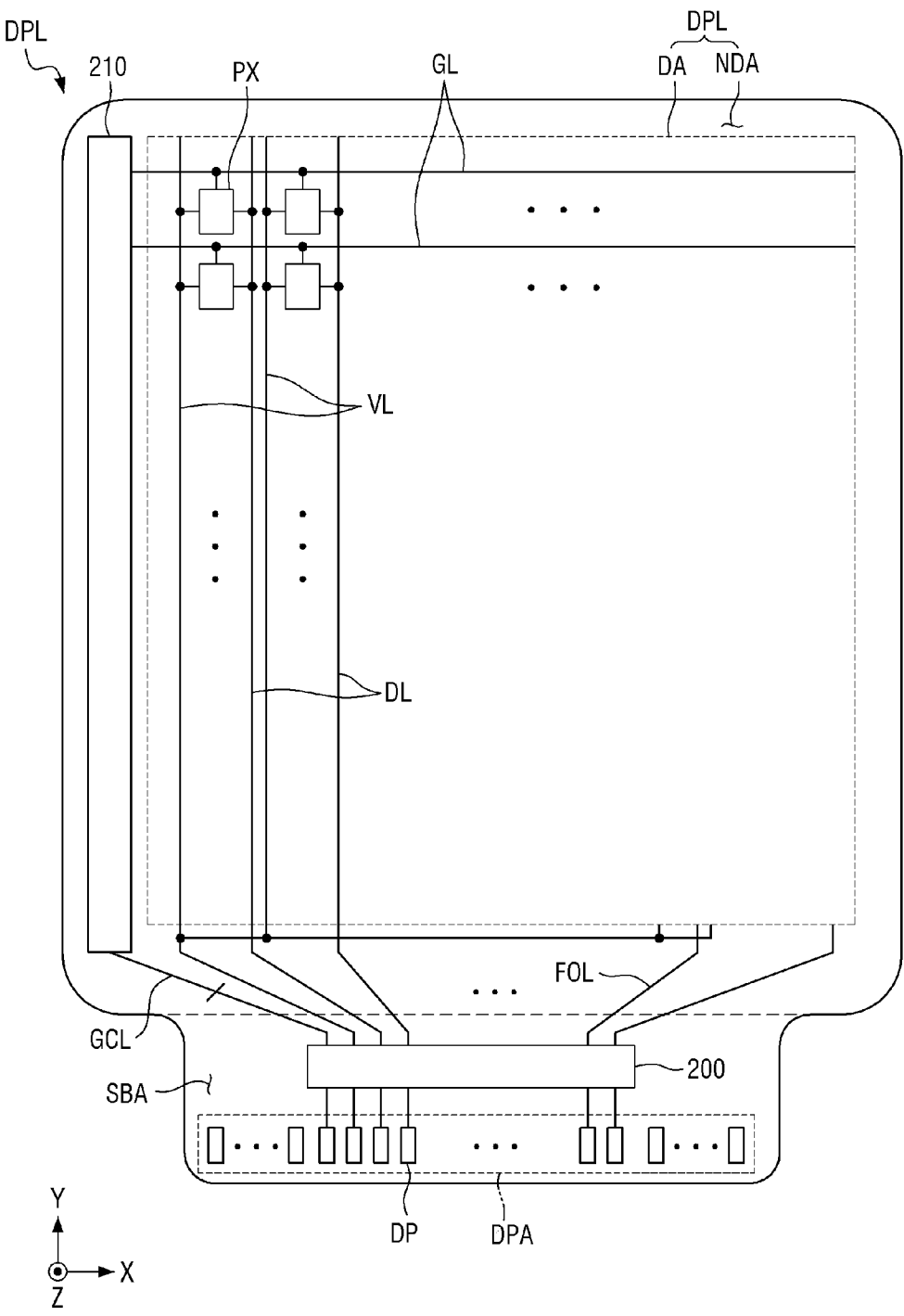
FIG. 4 is a plan view illustrating a display layer of a display device according to an embodiment.

FIG. 4 is a plan view illustrating a display layer DPL of a display device 10 according to an embodiment.

Referring to FIG. 4, the display layer DPL may include a display area DA and a non-display area NDA.

The display area DA may be disposed at the center of the display panel 100. A plurality of pixels PX, a plurality of gate lines GL, a plurality of data lines DL and a plurality of power lines VL may be disposed in the display area DA. Each of the plurality of pixels PX may be defined as a minimum unit for emitting light.

The plurality of gate lines GL may supply the gate signals received from a gate driver 210 to the plurality of pixels PX. The plurality of gate lines GL may be extended in the first direction DR1, and may be spaced apart from each other in the second direction Y crossing the first direction X.

The plurality of data lines DL may supply the data voltages received from the display driver 200 to the plurality of pixels PX. The plurality of data lines DL may be extended in the second direction Y, and may be spaced apart from each other in the first direction X.

The plurality of power lines VL may supply the power voltage received from the display driver 200 to the plurality of pixels PX. The power voltage may be at least one of a driving voltage, an initialization voltage, a reference voltage or a low potential voltage. The plurality of power lines VL may be extended in the second direction Y, and may be spaced apart from each other in the first direction X.

The non-display area NDA may surround the display area DA. A gate driver 210, fan-out lines FOL and gate control lines GCL may be disposed in the non-display area NDA. The gate driver 210 may generate a plurality of gate signals based on the gate control signal, and may sequentially supply the plurality of gate signals to the plurality of gate lines GL in accordance with a set order.

The fan-out lines FOL may extend from the display driver 200 to the display area DA. The fan-out lines FOL may supply the data voltages received from the display driver 200 to the plurality of data lines DL.

The gate control line GCL may extend from the display driver 200 to the gate driver 210. The gate control line GCL may supply the gate control signal received from the display driver 200 to the gate driver 210.

The sub-area SBA may include a display driver 200 and a pad area DPA.

The display driver 200 may output signals and voltages for driving the display panel 100 to the fan-out lines FOL. The display driver 200 may supply the data voltages to the data lines DL through the fan-out lines FOL. The data voltages may be supplied to the plurality of pixels PX, and may control luminance of the plurality of pixels PX. The display driver 200 may supply the gate control signal to the gate driver 210 through the gate control line GCL.

The pad area DPA may be disposed at an edge of the sub-area SBA. The pad area DPA may be electrically connected to the circuit board 300 by using a material such as, for example, an anisotropic conductive film or a self-assembly anisotropic conductive paste (SAP).

The pad area DPA may include a plurality of display pads DP. The plurality of display pads DP may be connected to a graphic system through the circuit board 300. The plurality of display pads DP may be connected to the circuit board 300 to receive digital video data, and may supply the digital video data to the display driver 200.

Figure 5:
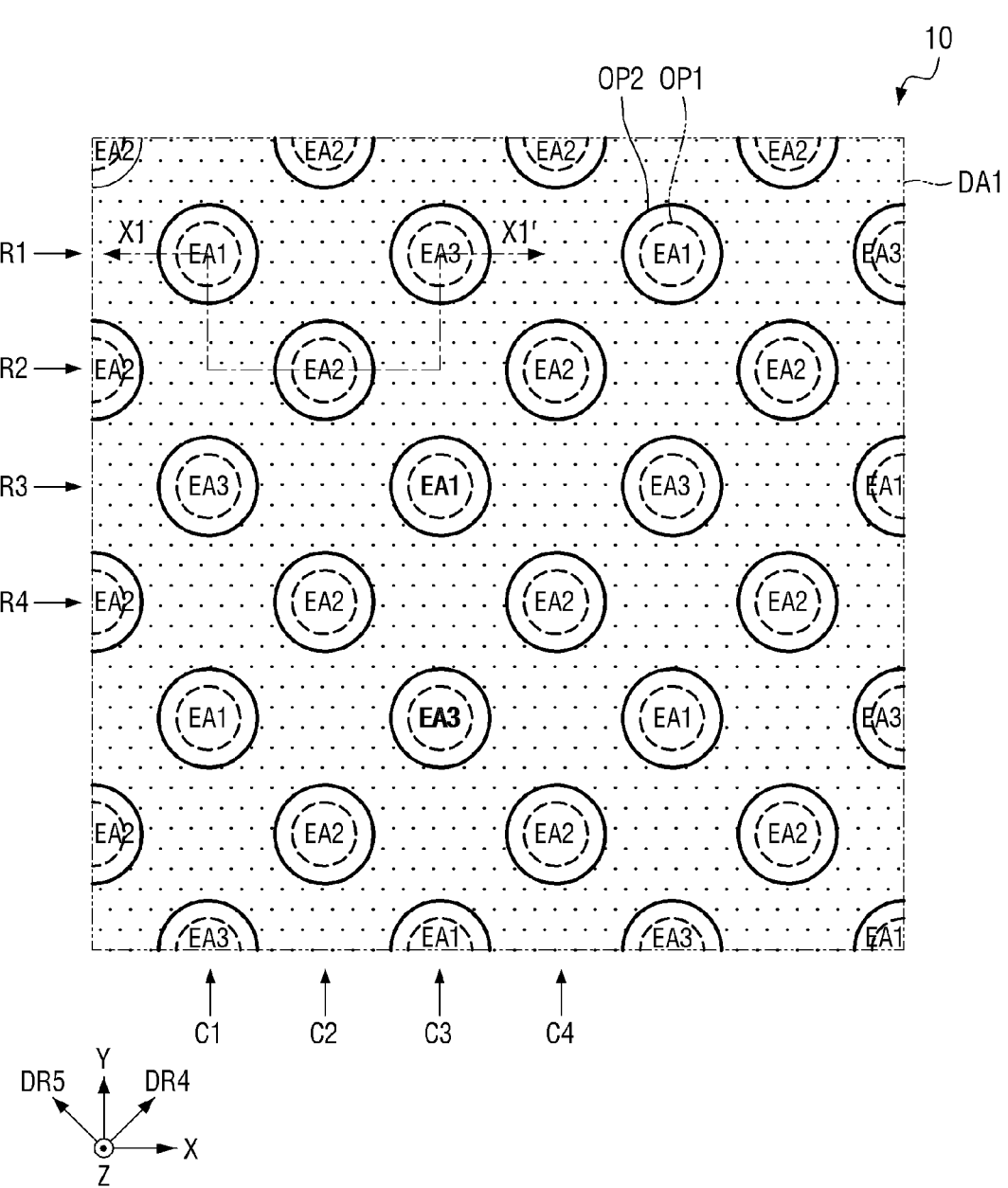
FIG. 5 is a plan view illustrating an arrangement of emission areas in a first display area of the display device according to an embodiment.

FIG. 5 is a plan view illustrating the arrangement of emission areas in a first display area of the display device according to the embodiment.

Referring to FIG. 5, the display device 10 may include a plurality of emission areas EA1 through EA3 disposed in the display area DA. The display area DA illustrated in FIG. 5 may be the first display area DA1 described herein, and the emission areas EA1 through EA3 may be disposed in the first display area DA1. However, in some embodiments, the emission areas EA1 through EA3 may also be disposed in a second display area DA2 and a third display area DA3 of the display area DA.

The emission areas EA1 through EA3 may include first emission areas EA1, second emission areas EA2, and third emission areas EA3 that emit light of different colors. Each of the first through third emission areas EA1 through EA3 may emit red, green or blue light, and the color of light emitted from each of the first through third emission areas EA1 through EA3 may vary according to the type of light emitting element ED1, ED2 or ED3 (see FIG. 6) disposed in a light emitting element layer 150, which will be described later herein. In an example embodiment, the first emission areas EA1 may emit red first light, the second emission areas EA2 may emit green second light, and the third emission areas EA3 may emit blue third light. However, the present disclosure is not limited thereto, and each of the first through third emission areas EA1 through EA3 may be configured to emit any of red light, green light, or blue light.

The emission areas EA1 through EA3 may be arranged in a PenTile™ type, for example, a diamond PenTile™ type. For example, the first emission areas EA1 and the third emission areas EA3 may be spaced apart from each other in the first direction X and may be alternately disposed in the first direction X and the second direction Y. In the arrangement of the emission areas EA1 through EA3, the first emission areas EA1 and the third emission areas EA3 may be alternately disposed in the first direction X in a first row R1 and a third row R3. The first emission areas EA1 and the third emission areas EA3 may be alternately disposed in the second direction Y in a first column C1 and a third column C3.

Each of the second emission areas EA2 may be spaced apart from other adjacent second emission areas EA2 in the first direction X and the second direction Y and may be spaced apart from adjacent first and third emission areas EA1 and EA3 in a fourth direction DR4 or a fifth direction DR5. The second emission areas EA2 may be repeatedly disposed along the first direction X and the second direction Y. The second emission areas EA2 and the first emission areas EA1 or the second emission areas EA2 and the third emission areas EA3 may be alternately disposed along the fourth direction DR4 or the fifth direction DR5. In the arrangement of the emission areas EA1 through EA3, the second emission areas EA2 may be repeatedly disposed in the first direction X in a second row R2 and a fourth row R4 and may be repeatedly disposed in the second direction Y in a second column C2 and a fourth column C4.

The first through third emission areas EA1 through EA3 may be respectively defined by a plurality of first openings OP1 and second openings OP2 formed by an inorganic pixel defining layer 151 (see FIG. 6) of the light emitting element layer 150 and a bank structure 160 (see FIG. 6), which will be described later herein.

Figure 6:
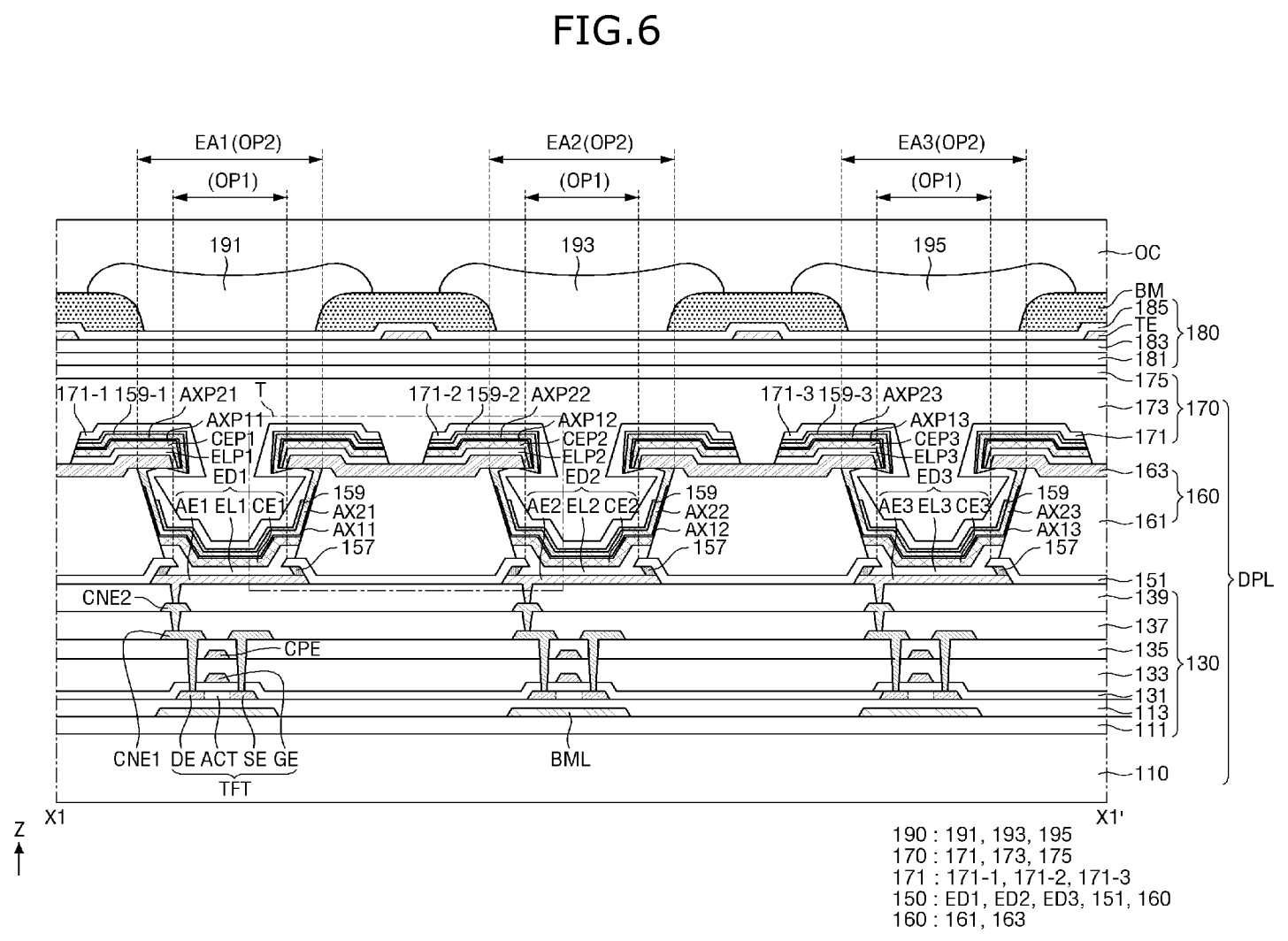

FIG. 6 is a cross-sectional view of a portion of the display device 10 according to an embodiment.

FIG. 6 is a partial cross-sectional view of the display device 10, illustrating cross-sections of a substrate 110, a thin-film transistor layer 130, the light emitting element layer 150, a thin-film encapsulation layer 170, a touch sensing layer 180, and a color filter layer 190.

Referring to FIG. 6, the display layer DPL may include the substrate 110, the thin-film transistor layer 130, the light emitting element layer 150, and the thin-film encapsulation layer 170.

Repeated detailed descriptions with respect to the substrate 110 will be omitted in the following descriptions for brevity.

The thin-film transistor layer 130 may include a first buffer layer 111, bottom metal layers BML, a second buffer layer 113, thin-film transistors TFT, a gate insulating layer 131, a first interlayer insulating layer 133, capacitor electrodes CPE, a second interlayer insulating layer 135, first connection electrodes CNE1, a first passivation layer 137, second connection electrodes CNE2, and a second passivation layer 139.

The first buffer layer 111 may be disposed on the substrate 110. The first buffer layer 111 may include an inorganic layer that can prevent penetration of air or moisture. In some examples, the first buffer layer 111 may include a plurality of inorganic layers alternately stacked.

The bottom metal layers BML may be disposed on the first buffer layer 111. In some examples, each of the bottom metal layers BML may be a single layer or a multilayer made of any one or more of molybdenum (Mo), aluminum (Al), chromium (Cr), gold (Au), titanium (Ti), nickel (Ni), neodymium (Nd), copper (Cu), and alloys thereof.

The second buffer layer 113 may cover the first buffer layer 111 and the bottom metal layers BML. The second buffer layer 113 may include an inorganic layer that can prevent penetration of air or moisture. In some examples, the second buffer layer 113 may include a plurality of inorganic layers alternately stacked.

The thin-film transistors TFT may be disposed on the second buffer layer 113 and may constitute respective pixel circuits of a plurality of pixels. For example, each of the thin-film transistors TFT may be a driving transistor or a switching transistor of a pixel circuit. Each of the thin-film transistors TFT may include a semiconductor layer ACT, a source electrode SE, a drain electrode DE, and a gate electrode GE.

The semiconductor layer ACT may be disposed on the second buffer layer 113. The semiconductor layer ACT may overlap a bottom metal layer BML and the gate electrode GE in the thickness direction and may be insulated from the gate electrode GE by the gate insulating layer 131. In portions of the semiconductor layer ACT, the material of the semiconductor layer ACT may be made conductive to form the source electrode SE and the drain electrode DE.

The gate electrode GE may be disposed on the gate insulating layer 131. The gate electrode GE may overlap the semiconductor layer ACT, with the gate insulating layer 131 interposed between the gate electrode GE and the semiconductor layer ACT.

The gate insulating layer 131 may be disposed on the semiconductor layers ACT. For example, the gate insulating layer 131 may cover the semiconductor layers ACT and the second buffer layer 113 and may insulate the semiconductor layers ACT from the gate electrodes GE. The gate insulating layer 131 may include contact holes through which the first connection electrodes CNE1 pass.

The first interlayer insulating layer 133 may cover the gate electrodes GE and the gate insulating layer 131. The first interlayer insulating layer 133 may include contact holes through which the first connection electrodes CNE1 pass. The contact holes of the first interlayer insulating layer 133 may be connected to the contact holes of the gate insulating layer 131 and contact holes of the second interlayer insulating layer 135.

The capacitor electrodes CPE may be disposed on the first interlayer insulating layer 133. The capacitor electrodes CPE may overlap the gate electrodes GE in the thickness direction. The capacitor electrodes CPE and the gate electrodes GE may form capacitances.

The second interlayer insulating layer 135 may cover the capacitor electrodes CPE and the first interlayer insulating layer 133. The second interlayer insulating layer 135 may include the contact holes through which the first connection electrodes CNE1 pass. The contact holes of the second interlayer insulating layer 135 may be connected to the contact holes of the first interlayer insulating layer 133 and the contact holes of the gate insulating layer 131.

The first connection electrodes CNE1 may be disposed on the second interlayer insulating layer 135. The first connection electrodes CNE1 may electrically connect the drain electrodes DE of the thin-film transistors TFT to the second connection electrodes CNE2. The first connection electrodes CNE1 may be inserted into the contact holes formed in the second interlayer insulating layer 135, the first interlayer insulating layer 133 and the gate insulating layer 131 to contact the drain electrodes DE of the thin-film transistors TFT.

The first passivation layer 137 may cover the first connection electrodes CNE1 and the second interlayer insulating layer 135. The first passivation layer 137 may protect the thin-film transistors TFT. The first passivation layer 137 may include contact holes through which the second connection electrodes CNE2 pass.

The second connection electrodes CNE2 may be disposed on the first passivation layer 137. The second connection electrodes CNE2 may electrically connect the first connection electrodes CNE1 to pixel electrodes AE1 through AE3 of light emitting elements ED1 through ED3. The second connection electrodes CNE2 may be inserted into the contact holes formed in the first passivation layer 137 to contact the first connection electrodes CNE1.

The second passivation layer 139 may cover the second connection electrodes CNE2 and the first passivation layer 137. The second passivation layer 139 may include contact holes through which the pixel electrodes AE1 through AE3 of the light emitting elements ED1 through ED3 pass.

The light emitting element layer 150 may be disposed on the thin-film transistor layer 130. The light emitting element layer 150 may include the light emitting elements ED1 through ED3, the inorganic pixel defining layer 151, and the bank structure 160. Each of the light emitting elements ED1 through ED3 may include a pixel electrode AE1, AE2 or AE3, a light emitting layer EL1, EL2 or EL3, and a common electrode CE1, CE2 or CE3.

The display device 10 may include a plurality of emission areas EA1 through EA3 disposed in the display area DA.

In some embodiments, the first through third emission areas EA1 through EA3 may have the same area or size. For example, in the display device 10, the second openings OP2 of the bank structure 160 may have the same diameter, and the first through third emission areas EA1 through EA3 may have the same area. However, the present disclosure is not limited thereto. For example, in the display device 10, the first through third emission areas EA1 through EA3 may have different areas or sizes. In an example, the area of each second emission area EA2 may be larger than the area of each first emission area EA1 and the area of each third emission area EA3, and the area of each third emission area EA3 may be larger than the area of each first emission area EA1. The intensity of light emitted from each of the emission areas EA1 through EA3 may vary according to the area of the emission area EA1, EA2 or EA3, and the color of a screen displayed on the display device 10 or the electronic device 1 may be controlled by adjusting the area of each of the emission areas EA1 through EA3. That is, for example, the electronic device 1 and the display device 10 are capable of freely adjusting the areas of the light emitting areas EA1, EA2 and EA3 according to a target color of the screen for the display device 10 and the electronic device 1.

In the display device 10, a first emission area EA1, a second emission area EA2 and a third emission area EA3, which are disposed to be adjacent to one another, may form one pixel group. A pixel group may include emission areas EA1, EA2 and EA3 that emit light of different colors, thereby representing a white gray scale, but the present disclosure is not limited thereto. Combination of the emission areas EA1, EA2 and EA3 constituting one pixel group may be modified in various ways depending on the arrangement of the emission areas EA1, EA2 and EA3 and the colors of light emitted from the emission areas EA1, EA2 and EA3.

The pixel electrodes AE1 through AE3 may be disposed on the second passivation layer 139. Each of the pixel electrodes AE1 through AE3 may overlap the second opening OP2 by the bank structure 160. The pixel electrodes AE1 through AE3 may be electrically connected to the drain electrodes DE of the thin-film transistors TFT through the first connection electrode and second connection electrode CNE1 and CNE2.

The pixel electrodes AE1 through AE3 may be disposed in the emission areas EA1 through EA3, respectively. The pixel electrodes AE1 through AE3 may include a first pixel electrode AE1 disposed in the first emission area EA1, a second pixel electrode AE2 disposed in the second emission area EA2, and a third pixel electrode AE3 disposed in the third emission area EA3. Each of the first pixel electrode AE1, the second pixel electrode AE2, and the third pixel electrode AE3 may be spaced apart from each other on the second passivation layer 139.

The pixel electrodes AE1 through AE3 may be respectively disposed in different emission areas EA1 through EA3 to form the light emitting elements ED1 through ED3 emitting light of different colors.

In an example embodiment, the pixel electrodes AE1 through AE3 may have a stacked structure of a material layer having a high work function such as, for example, indium tin oxide (ITO), indium zinc oxide (IZO), zinc oxide (ZnO) or indium oxide ($In_2O_3$) and a reflective material layer such as, for example, silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca) or a mixture thereof. The material layer having a high work function may be disposed on the reflective material layer so that it is located close to the light emitting layers EL1 through EL3. For example, the pixel electrodes AE1 through AE3 may have, but not limited to, a multilayer structure of ITO/Mg, ITO/MgF, ITO/Ag, or ITO/Ag/ITO.

The display device 10 may include the inorganic pixel defining layer 151 disposed on the second passivation layer 139 and the pixel electrodes AE1 through AE3. The inorganic pixel defining layer 151 may define a plurality of first openings OP1 forming the emission areas EA1, EA2 and EA3. The inorganic pixel defining layer 151 may be disposed on the entire surface of the second passivation layer 139, and partially overlap the pixel electrodes AE1, AE2 and AE3 while partially exposing upper surfaces of the pixel electrodes AE1, AE2 and AE3. For example, the inorganic pixel defining layer 151 may expose the pixel electrodes AE1, AE2 and AE3 at a portion overlapping the first bank opening OP1, and light emitting layers EL1, EL2 and EL3 respectively disposed on the pixel electrodes AE1, AE2 and AE3 may be directly disposed on the pixel electrodes AE1, AE2 and AE3.

The inorganic pixel defining layer 151 may include an inorganic insulating material. For example, the inorganic pixel defining layer 151 may include aluminum oxide, titanium oxide, tantalum oxide, hafnium oxide, zinc oxide, silicon oxide, silicon nitride, or silicon oxynitride.

The bank structure 160 may be positioned on the inorganic pixel defining layer 151. The bank structure 160 may define a plurality of second openings OP2 for forming the light emission areas EA1, EA2 and EA3 and the light emitting elements ED1, ED2 and ED3 of the display device 10 may be disposed to overlap the second opening OP2 of the bank structure 160. The bank structure 160 may include a first bank layer 161 and a second bank layer 163, which include their respective metal materials and structures different from each other to serve as different functions. The bank structure 160 will be described in more detail later.

The light emitting layers EL1 through EL3 may be disposed on the pixel electrodes AE1 through AE3. The light emitting layers EL1 through EL3 may be organic light emitting layers made of an organic material and may be formed on the pixel electrodes AE1 through AE3 through a deposition process. When the thin-film transistors TFT apply a predetermined voltage to the pixel electrodes AE1 through AE3 of the light emitting elements ED1 through ED3 and when the common electrodes CE1 through CE3 of the light emitting elements ED1 through ED3 receive a common voltage or a cathode voltage, holes and electrons may move to the light emitting layers EL1 through EL3 through a hole transporting layer and an electron transporting layer, respectively. Then, the holes and electrons may be combined with each other in the light emitting layers EL1 through EL3 to emit light.

The light emitting layers EL1 through EL3 may include a first light emitting layer EL1, a second light emitting layer EL2, and a third light emitting layer EL3 disposed in different emission areas EA1 through EA3. The first light emitting layer EL1 may be disposed on the first pixel electrode AE1 in the first emission area EA1, the second light emitting layer EL2 may be disposed on the second pixel electrode AE2 in the second emission area EA2, and the third light emitting layer EL3 may be disposed on the third pixel electrode AE3 in the third emission area EA3. The first through third light emitting layers EL1 through EL3 may be light emitting layers of the first through third light emitting elements ED1 through ED3, respectively. The first light emitting layer EL1 may be a light emitting layer emitting red light of the first color, the second light emitting layer EL2 may be a light emitting layer emitting green light of the second color, and the third light emitting layer EL3 may be a light emitting layer emitting blue light of the third color.

According to embodiments, portions of the light emitting layers EL1 through EL3 of the light emitting elements ED1 through ED3 may be disposed between the pixel electrodes AE1 through AE3 and the inorganic pixel defining layer 151. The inorganic pixel defining layer 151 may be disposed on the pixel electrodes AE1 through AE3 but may be spaced apart from upper surfaces of the pixel electrodes AE1 through AE3. In the deposition process of the light emitting layers EL1 through EL3, the materials of the light emitting layers EL1 through EL3 may be deposited in a direction inclined to an upper surface of the substrate 110 rather than in a direction perpendicular to the upper surface of the substrate 110. Accordingly, the light emitting layers EL1 through EL3 may be formed on the upper surfaces of the pixel electrodes AE1 through AE3 exposed through the second openings OP2 of the bank structure 160 and may fill spaces between the pixel electrodes AE1 through AE3 and the inorganic pixel defining layer 151. A deposition process of the light emitting layers EL1, EL2, and EL3 will be described in detail later.

In a fabrication process of the display device 10, temporary protective layers may be disposed between the inorganic pixel defining layer 151 and the pixel electrodes AE1 through AE3, then partially removed. In the area where the temporary protective layers are removed, the light emitting layers EL1 through EL3 may be disposed, and a lower surface of the inorganic pixel defining layer 151 may be spaced apart from the pixel electrodes AE1 through AE3. However, the temporary protective layers that are not removed may remain as residual patterns 157 in the areas between the inorganic pixel defining layer 151 and the pixel electrodes AE1 through AE3. Therefore, the areas between the inorganic pixel defining layer 151 and the pixel electrodes AE1 through AE3 may be filled with the residual patterns 157 and the light emitting layers EL1 through EL3.

The common electrodes CE1 through CE3 may be disposed on the light emitting layers EL1 through EL3. The common electrodes CE1 through CE3 may include a transparent conductive material to allow light generated by the light emitting layers EL1 through EL3 to pass therethrough. The common electrodes CE1 through CE3 may receive a common voltage or a low potential voltage. When the pixel electrodes AE1 through AE3 receive voltages corresponding to data voltages and the common electrodes CE1 through CE3 receive a low potential voltage, a potential difference may be formed between the pixel electrodes AE1 through AE3 and the common electrode CE1 through CE3. Accordingly, the light emitting layers EL1 through ED3 may emit light.

For example, the common electrodes CE1, CE2 and CE3 may include silver (Ag), but are not limited thereto. The common electrodes CE1, CE2, CE3 may include all of material layers having a low work function, such as, for example, Li, Ca, LiF/Ca, LiF/Al, Al, Mg, Pt, Pd, Ni, Au Nd, Ir, Cr, BaF, Ba or their compound or mixture (e.g., mixture of Ag and Mg). The common electrodes CE1, CE2 and CE3 may further include a transparent metal oxide layer disposed on the material layer having a low work function.

The common electrodes CE1, CE2 and CE3 may include a first common electrode CE1, a second common electrode CE2 and a third common electrode CE3, which are disposed in their respective light emission areas EA1, EA2 and EA3 different from one another. The first common electrode CE1 may be disposed on the first light emitting layer EL1 in the first light emission area EA1, the second common electrode CE2 may be disposed on the second light emitting layer EL2 in the second light emission area EA2, and the third common electrode CE3 may be disposed on the third light emitting layer EL3 in the third light emission area EA3.

In the display device 10 according to an embodiment of the present disclosure, the common electrodes CE1, CE2 and CE3 disposed in the different light emission areas EA1, EA2 and EA3 may be electrically connected to one another through the first bank layer 161 of the bank structure 160 without being directly connected to one another. Therefore, a portion of the common electrodes CE1, CE2 and CE3 may be disposed on a side of the first bank layer 161 of the bank structure 160.

First auxiliary electrodes AX11, AX12 and AX13 and second auxiliary electrodes AX21, AX22 and AX23 may be disposed on the common electrodes CE1, CE2 and CE3, respectively. The first auxiliary electrodes AX11, AX12 and AX13 and the second auxiliary electrodes AX21, AX22 and AX23 will be described in detail later.

Capping layers 159 may be disposed on the second auxiliary electrodes AX21, AX22 and AX23. The capping layers 159 may include an inorganic insulating material to cover the light emitting elements ED1 through ED3 and patterns disposed on the bank structure 160. The capping layers 159 may prevent the light emitting elements ED1 through ED3 from being damaged by external air and prevent the patterns disposed on the bank structure 160 from being peeled off during the fabrication process of the display device 10. In an example embodiment, the capping layers 159 may include aluminum oxide, titanium oxide, tantalum oxide, hafnium oxide, zinc oxide, silicon oxide, silicon nitride, or silicon oxynitride.

The thin-film encapsulation layer 170 may be disposed on the light emitting elements ED1 through ED3 and the bank structure 160 and may cover the light emitting elements ED1 through ED3 and the bank structure 160. The thin-film encapsulation layer 170 may include at least one inorganic layer to prevent oxygen or moisture from penetrating into the light emitting element layer 150. The thin-film encapsulation layer 170 may include at least one organic layer to protect the light emitting element layer 150 from foreign substances such as, for example, dust. In an example embodiment, the thin-film encapsulation layer 170 may include a first encapsulation layer 171, a second encapsulation layer 173, and a third encapsulation layer 175 stacked sequentially. The first encapsulation layer 171 and the third encapsulation layer 175 may be inorganic encapsulation layers, and the second encapsulation layer 173 disposed between the first encapsulation layer 171 and the third encapsulation layer 175 may be an organic encapsulation layer.

Each of the first encapsulation layer 171 and the third encapsulation layer 175 may include one or more inorganic insulating materials. The inorganic insulating materials may include aluminum oxide, titanium oxide, tantalum oxide, hafnium oxide, zinc oxide, silicon oxide, silicon nitride, and silicon oxynitride.

The second encapsulation layer 173 may include a polymer-based material. Examples of the polymer-based material may include acrylic resin, epoxy resin, polyimide, and polyethylene. For example, the second encapsulation layer 173 may include acrylic resin such as, for example, polymethyl methacrylate or polyacrylic acid. The second encapsulation layer 173 may be formed by curing a monomer or applying a polymer.

The first encapsulation layer 171 may include a first inorganic layer 171-1, a second inorganic layer 171-2, and a third inorganic layer 171-3 disposed to correspond to different emission areas EA1 through EA3, respectively.

The touch sensing layer 180 may be disposed on the thin-film encapsulation layer 170. The touch sensing layer 180 may include a touch buffer layer 181, a touch insulating layer 183, touch electrodes TE, and a touch protection layer 185.

The touch buffer layer 181 may be disposed on the thin-film encapsulation layer 170. The touch buffer layer 181 may have insulating and optical functions. The touch buffer layer 181 may include at least one inorganic layer. Optionally, the touch buffer layer 181 may be omitted. Although not illustrated in the drawings, a connection electrode electrically connecting the touch electrodes may be disposed on the touch buffer layer 181. The connection electrode may be a single layer of molybdenum (Mo), titanium (Ti), copper (Cu), aluminum (Al) or indium tin oxide (ITO) or may be a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide.

The touch insulating layer 183 may cover the touch buffer layer 181. For example, the touch insulating layer 183 may be an inorganic layer including at least one of a silicon nitride layer, a silicon oxynitride layer, a silicon oxide layer, a titanium oxide layer, and an aluminum oxide layer.

Some of the touch electrodes TE may be disposed on the touch insulating layer 183. Each of the touch electrodes TE may not overlap the first through third emission areas EA1 through EA3. Each of the touch electrodes TE may be a single layer of molybdenum (Mo), titanium (Ti), copper (Cu), aluminum (Al) or indium tin oxide (ITO) or may be a stacked structure (Ti/Ali) of aluminum and titanium, a stacked structure (ITO/AV/ITO) of aluminum and indium tin oxide, an APC alloy, or a stacked structure (ITO/APC/ITO) of an APC alloy and indium tin oxide.

The touch protection layer 185 may cover the touch electrodes TE and the touch insulating layer 183. The touch protection layer 185 may have insulating and optical functions. The touch protection layer 185 may be made of at least one of the example materials of the touch insulating layer 183.

A light blocking layer BM may be disposed on the touch sensing layer 180. The light blocking layer BM may overlap the inorganic pixel defining layer 151 and the bank structure 160. The light blocking layer BM may include a light absorbing material. For example, the light blocking layer BM may include an inorganic black pigment or an organic black pigment. The inorganic black pigment may be carbon black, and the organic black pigment may include at least one of lactam black, perylene black, and aniline black. However, the present disclosure is not limited thereto. The light blocking layer BM may prevent color mixing by preventing intrusion of visible light between the first through third emission areas EA1 through EA3, thereby improving a color gamut of the display device 10.

The color filter layer 190 may be disposed on the touch protection layer 185 and the light blocking layer BM to overlap the emission areas EA1 through EA3.

The color filter layer 190 may include a first color filter 191, a second color filter 193, and a third color filter 195 disposed to correspond to different emission areas EA1 through EA3, respectively. Each of the color filters 191, 193 and 195 may include a colorant such as, for example, a dye or pigment that absorbs light in wavelength bands other than light in a specific wavelength band and may be disposed to correspond to the color of light emitted from one of the emission areas EA1 through EA3. For example, the first color filter 191 may be a red color filter that overlaps the first emission area EA1 and transmits only red first light. The second color filter 193 may be a green color filter that overlaps the second emission area EA2 and transmits only green second light, and the third color filter 195 may be a blue color filter that overlaps the third emission area EA3 and transmits only blue third light.

In FIG. 6, each of the color filters 191, 193 and 195 is spaced apart from other adjacent color filters 191, 193 and 195 on the light blocking layer BM. However, the present disclosure is not limited thereto. That is, each of the color filters 191, 193 and 195 may also partially overlap other adjacent color filters 191, 193 and 195. The different color filters 191, 193 and 195 may overlap each other on the light blocking layer BM in areas not overlapping the emission areas EA1 through EA3.

An overcoat layer OC may be disposed on the color filter layer 190 and the light blocking layer BM to planarize upper ends of the color filters 191, 193 and 195. The overcoat layer OC may be a colorless light-transmitting layer that does not have a color in a visible light band. For example, the overcoat layer OC may include a colorless light-transmitting organic material such as, for example, acrylic resin.

Figure 7:
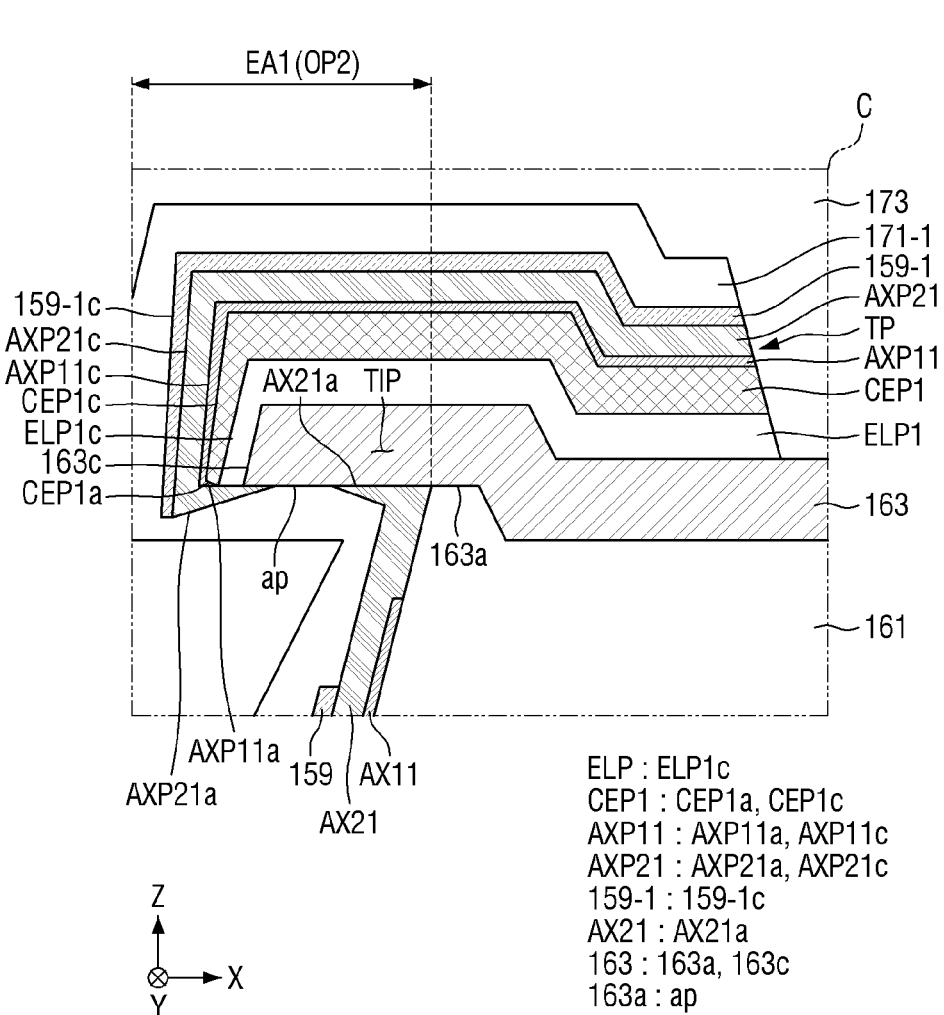
FIG. 7 is a cross-sectional view of a first emission area EA1 of FIG. 6.
Figure 8:
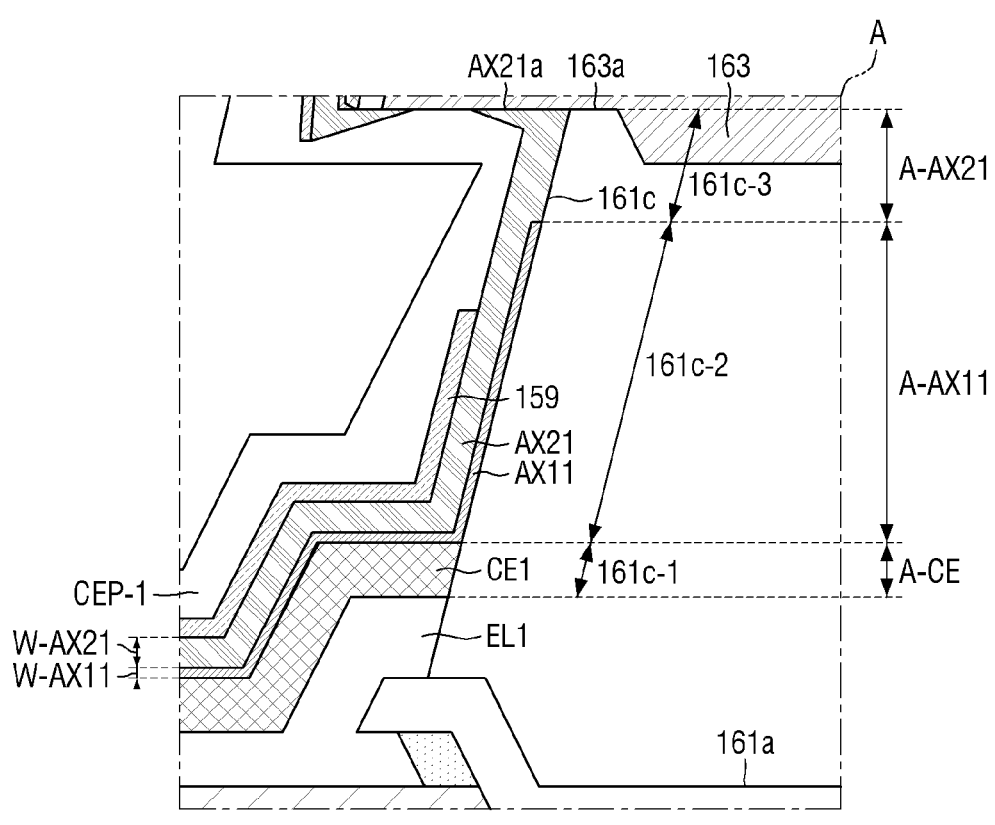
FIG. 8 is an enlarged view of area 'A' of FIG. 7.
Figure 8:
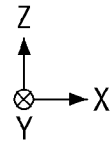

FIG. 7 is a cross-sectional view of the first emission area EA1 of FIG. 6, illustrating the first light emitting element ED1 disposed in the first emission area EA1 and a portion of the bank structure 160 around the first light emitting element ED1. FIG. 8 is an enlarged view of area 'A' of FIG. 7.

Referring to FIG. 7, the bank structure 160 may be positioned on the inorganic pixel defining layer 151. The bank structure 160 may include a first bank layer 161 and a second bank layer 163.

The first bank layer 161 may be positioned on the inorganic pixel defining layer 151. The first bank layer 161 may include metal having high electrical conductivity. For example, the first bank layer 161 may include aluminum (Al) having high electrical conductivity.

In some embodiments, the first bank layer 161 may include a first surface 161a in contact with the inorganic pixel defining layer 151 and side surfaces 161c facing the first opening OP1.

The first surface 161a of the first bank layer 161 may be located along the inorganic pixel defining layer 151. Accordingly, the first surface 161a of the first bank layer 161 may cover the step of the inorganic pixel defining layer 151.

The side surfaces 161c of the first bank layer 161 may be located at an angle corresponding to a direction between the first direction X and the third directions Z. In some embodiments, the bank structure 160 may be formed by deposition and etching processes instead of a mask process, and the first bank layer 161 may be formed by a wet etch process. Therefore, the side surface 161c of the first bank layer 161 may be more recessed in the first direction X than the inorganic pixel definition layer 151 and thus may be of an inclined surface shape. For example, the side surface 161c may be positioned in an inclined surface shape inclined in the first direction X based on the third direction Z.

The first bank layer 161 may be electrically connected to the common electrodes CE1, CE2, and CE3, the first auxiliary electrodes AX11, AX12 and AX13, and the second auxiliary electrodes AX21, AX22 and AX23. In some aspects, the increased contact area between the common electrodes CE1, CE2 and CE3, the first auxiliary electrodes AX11, AX12 and AX13, and the second auxiliary electrodes AX21, AX22 and AX23 with the first bank layer 161, may reduce the electrical resistance of display device 10. In an example embodiment, the thickness W161 of the first bank layer 161 may be greater than the thickness W163 of the second bank layer 163.

The second bank layer 163 may be positioned on the first bank layer 161. The second bank layer 163 may include a material having an etch rate lower than an etch rate of the first bank layer 161, and for example, the second bank layer 163 may include titanium (Ti).

In some embodiments, the second bank layer 163 may include a first surface 163a facing the first bank layer 161 and a side surface 163c facing the first opening OP1. The second bank layer 163 may be formed through a wet etching process similar or identical to the formation of the first bank layer 161. The second bank layer 163 may include a material relatively stable to the wet etching process as compared with the first bank layer 161, and thus, the side surface 163c of the second bank layer 163 may be shaped such that the side surface 163c protrudes toward the first opening OP1 more than the side surface 161c of the first bank layer 161 toward the first opening OP1. In other words, the side surface 161c of the first bank layer 161 may be shaped such that the side surface 161c is depressed inward from the side surface 163c of the second bank layer 163. Accordingly, the second bank layer 163 of the bank structure 160 may include a tip TIP protruding toward the first opening OP1, and an undercut may be formed between a lower portion of the tip TIP of the second bank layer 163 and the side surface 161c of the first bank layer 161.

In some embodiments, the light emitting layers EL1, EL2 and EL3 and the common electrodes CE1, CE2 and CE3 may be formed through a thermal evaporation process. Since the thermal evaporation process is performed in a high vacuum chamber, the light emitting layers EL1, EL2 and EL3 and the common electrodes CE1, CE2 and CE3 can move with a relatively large value mean free path compared to a mean free path resulting from a sputter deposition process. Therefore, the particles of the light emitting layers EL1, EL2 and EL3 and the common electrodes CE1, CE2 and CE3 formed during the manufacturing process may move with a relatively larger value of mean free path than the particles of the first auxiliary electrodes AX11, AX12 and AX13 and the second auxiliary electrodes AX21, AX22 and AX23, which will be described later herein.

As described herein, the common electrodes CE1, CE2 and CE3 of the display device 10 may be indirectly connected. For example, the common electrodes CE1, CE2 and CE3 may be electrically connected through the first bank layer 161 of the bank structure 160. Accordingly, when the contact area between the first bank layer 161 and the common electrodes CE1, CE2 and CE3 is formed to be wide (e.g., such that the contact area between the first bank layer 161 and the common electrodes CE1, CE2 and CE3 is greater than a threshold distance), the electrical resistance of the display device 10 may be reduced, thereby improving luminance. In some cases, as the particles of the common electrodes CE1, CE2 and CE3 may move linearly, material may not be smoothly deposited below the protruding tip TIP of the bank structure 160. In accordance with one or more embodiments of the present disclosure, a structure is described herein that is capable of reducing electrical resistance of the display device 10 by assisting the common electrodes CE1, CE2 and CE3.

Referring to FIGS. 7 and 8, a first auxiliary electrode AX11 may be positioned to completely cover the first common electrode CE1 in an area overlapping the first opening OP1. For example, the first auxiliary electrode AX11 may completely overlap the first common electrode CE1 according to a plan view. In addition, in an area overlapping the second opening OP2, the first auxiliary electrode AX11 may be positioned to partially cover a side surface 161c of the first bank layer 161 and be in contact with the side surface 161c of the first bank layer 161. In other words, the first auxiliary electrode AX11 positioned to overlap the second opening OP2 may completely cover the first common electrode CE1 in a direction toward the second bank layer 163, and may extend along the side surface 161c of the bank layer 161. In some embodiments, the first auxiliary electrode AX11 may be spaced apart from the first surface 163a of the second bank layer 163. In some alternative and/or additional embodiments, examples in which an area is described as "overlapping the . . . opening" may include implementations in which the area is equal to the area of the opening.

In some embodiments, the first auxiliary electrodes AX11, AX12 and AX13 have excellent electrical and thermal conductivity (e.g., electrical and thermal conductivity greater than or equal to a target electrical and thermal conductivity), and may include, for example, a silver (Ag) compound. Specifically, the first auxiliary electrodes AX11, AX12 and AX13 may include a silver-palladium-copper compound (Ag—Pd—Cu, APC) to which palladium and copper are added at 1 wt % or less. That is, the silver (Ag) content of the first auxiliary electrodes AX11, AX12 and AX13 may be equal to or greater than 99 wt %.

The first auxiliary electrodes AX11, AX12 and AX13 may be formed through a sputter deposition process. For example, since the sputter deposition process is performed in a relatively low vacuum compared to the thermal evaporation process, the mean free path of the particles forming the first auxiliary electrodes AX11, AX12 and AX13 may be formed smaller than the mean free path of the particles forming the light emitting layers EL1 through EL3 and the common electrodes CE1, CE2 and CE3. Accordingly, the first auxiliary electrodes AX11, AX12 and AX13 may be formed such that the step coverage of first auxiliary electrodes AX11, AX12 and AX13 is higher than the step coverage of the light emitting layers EL1, EL2 and EL3 and the common electrodes CE1, CE2 and CE3. In some aspects, the higher step coverage may support reduced complexity associated with depositing the first auxiliary electrodes AX11, AX12 and AX13 below the protruding tip TIP of the bank structure 160 (e.g., the first auxiliary electrodes AX11, AX12 and AX13 may be easily deposited below the protruding tip TIP of the bank structure 160). The first auxiliary electrodes AX11, AX12 and AX13 may be deposited on the side surface 161c of the first bank layer 161 with an area larger than areas of the common electrodes CE1, CE2 and CE3 in an area overlapping the protruding tip TIP of the bank structure 160. Expressed another way, the first auxiliary electrodes AX11, AX12 and AX13 may be deposited on the side surface 161c of the first bank layer 161 such that respective areas of first auxiliary electrodes AX11, AX12 and AX13 according to a plan view are larger than (and may completely overlap, at least in the X direction) respective areas of the common electrodes CE1, CE2 and CE3. Accordingly, for example, the display device 10 may have low electrical resistance and the luminance of the display device 10 may be improved.

Referring to FIG. 8, a thickness W-AX11 of the first auxiliary electrode AX11 in the third direction Z may be 30 Å or more and 50 Å or less. It is to be understood that the phrases referring to a measurement as "X or more and Y or less" may refer to the measurement as having a value ranging from X to Y.

As shown in FIG. 8, in an example dividing the side surface 161c of the first bank layer 161 into a first portion 161c-1 in contact with the first common electrode CE1 and a second portion 161c-2 in contact with the first auxiliary electrode AX11, an area A-CE of the first portion 161c-1 where the first common electrode CE1 contacts the side surface 161c of the first bank layer 161 may be smaller than an area A-AX11 of the second portion 161c-2 where the first auxiliary electrode AX11 contacts the side surface 161c of the first bank layer 161. The term "area" described herein (e.g., with reference to area A-CE, area A-AX11, and the like) may refer to thickness and length in a cross-sectional view. For convenience of description, only the first auxiliary electrode AX11 positioned in the first emission area is shown in FIGS. 7 and 8, and the first auxiliary electrodes AX12 and AX13 positioned in the second emission area EA2 and the third emission area EA3, respectively, may include the same structure and characteristics described with reference to the first auxiliary electrode AX11.

In some embodiments, second auxiliary electrodes AX21, AX22 and AX23 may be positioned on the first auxiliary electrodes AX11, AX12 and AX13, respectively.

Referring to FIGS. 7 and 8, the second auxiliary electrode AX21 may be positioned to completely cover the first auxiliary electrode AX11 in an area overlapping the first opening OP1. For example, the second auxiliary electrode AX21 may completely cover the first auxiliary electrode AX11 in the area overlapping the first opening OP1, and further, may completely overlap the first auxiliary electrode AX11 according to a plan view. In addition, in an area overlapping the second opening OP2, the second auxiliary electrode AX21 may be positioned along the side surface 161c of the first bank layer 161 to completely cover the first auxiliary electrode AX11. For example, the second auxiliary electrode AX21 may completely cover the first auxiliary electrode AX11 along the side surface 161c of the first bank layer 161.

As described herein, in an area overlapping the second opening OP2, the first auxiliary electrode AX11 may not be in contact with the first surface 163a of the second bank layer 163, and the first auxiliary electrode AX11 and the first surface 163a may be spaced apart from each other. Accordingly, a portion cp of the side surface 161c of the first bank layer 161 may be exposed without being covered by the first auxiliary electrode AX11. Accordingly, the partially exposed side surface 161c of the first bank layer 161 may be completely covered by the second auxiliary electrode AX21.

Referring to FIG. 8, the second auxiliary electrode AX21 positioned to overlap the second opening OP2 may extend along the side surface 161c of the first bank layer 161, and the second auxiliary electrode AX21 may be in contact with the first surface 163a of the second bank layer 163. Accordingly, the second auxiliary electrode AX21 may include a cover surface AX21a of the second auxiliary electrode AX21 in contact with the first surface 163a of the second bank layer 163. For example, a thickness W-AX21 of the second auxiliary electrode AX21 may have a value of 500 Å or more and 700 Å or less.

In some embodiments, the second auxiliary electrodes AX21, AX22 and AX23 may have high light transmittance and low moisture permeability, and may have excellent adhesion to the first encapsulation layer 171. Accordingly, the second auxiliary electrodes AX21, AX22 and AX23 may completely cover the first auxiliary electrodes AX11, AX12 and AX13 and the common electrodes CE1, CE2 and CE3 so that moisture does not penetrate. Accordingly, the second auxiliary electrodes AX21, AX22 and AX23 may help improve reliability of the display device 10.

In some embodiments, the second auxiliary electrodes AX21, AX22 and AX23 may include a transparent conductive material. For example, the second auxiliary electrodes AX21, AX22 and AX23 may include indium-zinc oxide (IZO). In an example embodiment, the second auxiliary electrodes AX21, AX22 and AX23 may include 90 wt % of indium oxide and 10 wt % of zinc oxide, but the present disclosure is not limited thereto.

The second auxiliary electrodes AX21, AX22 and AX23 may be formed through a sputter deposition process. More specifically, in the sputter deposition process, the mean free path of the particles can be adjusted by adjusting the pressure, gas, thickness of the deposition material, and the like. That is, the step coverage of the second auxiliary electrodes AX21, AX22 and AX23 may be adjusted to be higher than the step coverage of the first auxiliary electrodes AX11, AX12 and AX13. Accordingly, the area of the second auxiliary electrodes AX21, AX22 and AX23 covering the side surface 161c of the first bank layer 161 may be larger than the area of the first auxiliary electrodes AX11, AX12 and AX13.

As shown in FIG. 8, when dividing the side surface 161c of the first bank layer 161 into a second portion 161c-2 where the first auxiliary electrode AX11 is in contact and a third portion 161c-3 where the second auxiliary electrode AX21 is in contact, an area A-AX21 of the third portion 161c-3 where the second auxiliary electrode AX21 contacts the side surface 161c of the first bank layer 161 may be smaller than an area A-AX11 of the second portion 161c-2 where the first auxiliary electrode AX11 contacts the side surface 161c of the first bank layer 161. The meaning of the area mentioned above may be expressed as thickness and length in a cross-sectional view. Specifically, the area of the side surface 161c of the first bank layer 161 covered by the second auxiliary electrode AX21 may be greater than the area of the side surface 161c of the first bank layer 161 covered by the first auxiliary electrode AX11, but the area A-AX21 where the second auxiliary electrode AX21 comes into contact with the side surface 161c of the first bank layer 161 may be smaller than the area A-AX11 where the first auxiliary electrode AX11 comes into contact with the side surface 161c of the first bank layer 161. Although only the second auxiliary electrode AX21 positioned in the first emission area is shown in FIGS. 7 and 8 for convenience of description, the second auxiliary electrodes AX22 and AX23 positioned in the second emission area EA2 and the third emission area EA3, respectively, may also include the same structure and characteristics.

Figure 9:
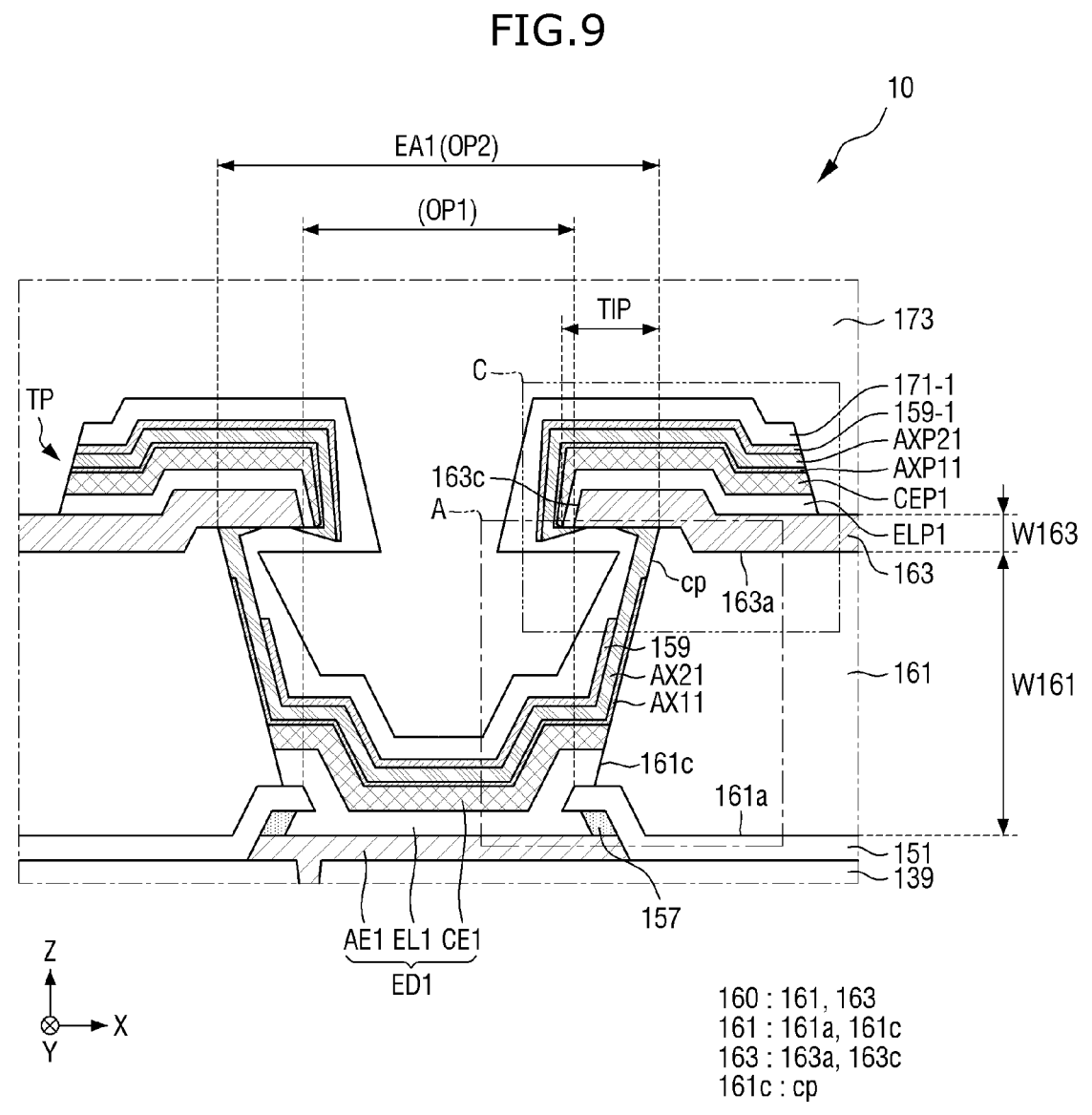

FIG. 9 is an enlarged cross-sectional view of area 'C' of FIG. 7.

Referring to FIGS. 6 to 9, the display device 10 may include organic patterns ELP1 through ELP3, electrode patterns CEP1 through CEP3, and capping patterns 159-1 through 159-3.

The organic patterns ELP1 through ELP3, the electrode patterns CEP1 through CEP3, and the capping patterns 159-1 through 159-3 may be disposed on the bank structure 160 and may surround the emission areas EA1 through EA3 or the first openings OP1. The stacked structure of the organic patterns ELP1 through ELP3, the electrode patterns CEP1 through CEP3, and the capping patterns 159-1 through 159-3 disposed around the emission areas EA1 through EA3 may be partially etched during the fabrication process of the display device 10, and thus the pattern shapes may change. Accordingly, portions of an upper surface of the second bank layer 163 of the bank structure 160 may not be covered by the organic patterns ELP1 through ELP3, the electrode patterns CEP1 through CEP3 and the capping patterns 159-1 through 159-3, and a trench TP may be formed in these portions by the above patterns.

The organic patterns ELP1 through ELP3 may be disposed on the second bank layer 163 to partially overlap the second bank layer 163. The organic patterns ELP1 through ELP3 may include the same material as light emitting layers EL1 through EL3 of the light emitting elements ED1 through ED3. The first organic pattern ELP1 may include the same material as the first light emitting layer EL1 of the first light emitting element ED1, the second organic pattern ELP2 may include the same material as the second light emitting layer EL2 of the second light emitting element ED2, and the third organic pattern ELP3 may include the same material as the third light emitting layer EL3 of the third light emitting element ED3. In accordance with the descriptions herein, it is to be understood that the phrase "pattern . . . may include the same material as" may be equivalent to "pattern . . . may be formed of the same material as."

The organic patterns ELP1 through ELP3 may be traces formed by being separated from the light emitting layers EL1 through EL3 because the bank structure 160 includes the tips TIP. The light emitting layers EL1 through EL3 may be formed in the first and second openings OP1 and OP2, and the organic patterns ELP1 through ELP3 may be separated from the light emitting layers EL1 through EL3 by the tips TIP of the bank structure 160.

Referring to FIG. 9, the first organic pattern ELP1 may be positioned on the second bank layer 163 in an area overlapping the second opening OP2 and include the side surface ELP1c of the first organic pattern ELP1 covering the side surface 163c of the second bank layer 163. The second organic pattern ELP2 and the third organic pattern ELP3 may also have the same structure as the first organic pattern ELP1.

The plurality of electrode patterns CEP1, CEP2 and CEP3 may be disposed on the plurality of organic patterns ELP, ELP and ELP3, respectively. The electrode patterns CEP1, CEP2 and CEP3 may include the first electrode pattern CEP1, the second electrode pattern CEP2 and the third electrode pattern CEP3 of the respective light emitting elements ED1, ED2 and ED3, each of which includes the same material as the material included in the common electrodes CE1, CE2 and CE3. For example, the first electrode pattern CEP1, the second electrode pattern CEP2 and the third electrode pattern CEP3 may be disposed directly on the first organic pattern ELP1, the second organic pattern ELP2 and the third organic pattern ELP3, respectively. The arrangement relation of the electrode patterns CEP1, CEP2 and CEP3 and the organic patterns ELP1, ELP2 and ELP3 may be the same as the arrangement relation of the light emitting layers EL1, EL2 and EL3 and the common electrodes CE1, CE2 and CE3 of the respective light emitting elements ED1, ED2 and ED3. Since the bank structure 160 includes the tip TIP, the electrode patterns CEP1, CEP2 and CEP3 may be marks formed as the deposited material is disconnected without being connected to the common electrodes CE1, CE2 and CE3. In the display device 10, the common electrodes CE1, CE2 and CE3 may be individually formed in different areas by the tip TIP of the bank structure 160 even in a deposition process in which a mask is not used.

Referring to FIG. 9, the first electrode pattern CEP1 may be positioned on the first organic pattern ELP1 in an area overlapping the second opening OP2. In the area overlapping the second opening OP2, the first electrode pattern CEP1 may include a side surface CEP1c of the first electrode pattern CEP1 covering the side surface ELP1c of the first organic pattern ELP1 and a lower surface CEP1a of the first electrode pattern CEP1 positioned toward the first bank layer 161. The second electrode pattern CEP2 and the third electrode pattern CEP3 may also have the same structure as the first electrode pattern CEP1.

The plurality of first auxiliary patterns AXP11, AXP12 and AXP13 may be disposed on the plurality of electrode patterns CEP1, CEP2 and CEP3, respectively. The first auxiliary patterns AXP11, AXP12 and AXP13 may include the same material as the first auxiliary electrodes AX11, AX12 and AX13. The arrangement relationship between the electrode patterns CEP1, CEP2 and CEP3 and the first auxiliary patterns AXP11, AXP12 and AXP13 is similar to the arrangement relationship between the common electrodes CE1, CE2 and CE3 and the first auxiliary electrodes AX11, AX12 and AX13. Since the bank structure 160 includes the tip TIP, the first auxiliary electrodes AX11, AX12 and AX13 may be marks formed as the deposited material is disconnected without being connected to the first auxiliary electrodes AX11, AX12 and AX13. In the display device 10, the first auxiliary electrodes AX11, AX12 and AX13 may be individually formed in different areas by the tip TIP of the bank structure 160 even in a deposition process in which a mask is not used.

Referring to FIG. 9, the first auxiliary pattern AXP11 may be positioned to completely cover the first electrode pattern CEP1 in an area overlapping the second opening OP2. The first auxiliary pattern AXP11 may include a side surface AXP11c of the first auxiliary pattern AXP11 covering a side surface CEP1c of the first electrode pattern CEP1 and a lower surface AXP11a of the first auxiliary pattern AXP11 covering a lower surface CEP1a of the first electrode pattern CEP1. As described herein, since the first auxiliary electrodes AX11, AX12 and AX13 have high step coverage characteristics, the first auxiliary electrodes AX11, AX12 and AX13 may cover both the side surface CEP1c and the bottom surface CEP1a of the electrode patterns CEP1, CEP2, and CEP3, respectively. Although the first auxiliary pattern AXP11 overlapping the first emission area is described for convenience of description, the first auxiliary patterns AXP12 and AXP13 positioned in the second emission area EA2 and the third emission area EA3, respectively, may also include the same structure and characteristics.

The plurality of second auxiliary patterns AXP21, AXP22 and AXP23 may be disposed on the plurality of first auxiliary patterns AXP11, AXP12 and AXP13, respectively. The second auxiliary patterns AXP21, AXP22 and AXP23 may include the same material as the second auxiliary electrodes AX21, AX22 and AX23. Since the bank structure 160 includes the tip TIP, the second auxiliary patterns AXP11, AXP12 and AXP13 may be marks formed as the deposited material is disconnected without being connected to the second auxiliary patterns AXP11, AXP12 and AXP13. In the display device 10, the second auxiliary patterns AXP11, AXP12 and AXP13 may be individually formed in different areas by the tip TIP of the bank structure 160 even in a deposition process in which a mask is not used.

Referring to FIG. 9, the second auxiliary pattern AXP21 may be positioned to completely cover the first auxiliary pattern AXP11 in an area overlapping the second opening OP2. The second auxiliary pattern AXP21 may include a side surface AXP21c of the second auxiliary pattern AXP21 covering the side surface AXP11c of the first second auxiliary pattern AXP11 and a lower surface AXP21a of the second auxiliary pattern AXP21 covering the lower surface AXP11a of the first second auxiliary pattern AXP11. As described herein, since the second auxiliary patterns AX21, AX22 and AX23 have higher step coverage characteristics than the first auxiliary patterns AX11, AX12 and AX13, the lower surface AXP21a of the second auxiliary pattern AXP21 may cover the lower surface CEP1a of the first electrode pattern CEP1 facing the first bank layer 161 and extend thereto to cover up to a portion of the first surface 163a of the second bank layer 163.

In some embodiments, the lower surface AXP21a of the second auxiliary pattern AXP21 may be positioned to be spaced apart from the cover surface AX21a of the second auxiliary electrode AX21. The first surface 163a of the second bank layer 163 may be in contact with the inorganic layer 171-1 at a spaced portion ap (e.g., an area or region) between the lower surface AXP21a of the second auxiliary pattern AXP21 and the cover surface AX21a of the second auxiliary electrode AX21.

Although the second auxiliary pattern AXP21 overlapping the first emission area is described for convenience of description, the second auxiliary patterns AXP12 and AXP13 positioned in the second emission area EA2 and the third emission area EA3, respectively, may also include the same structure and characteristics.

In some embodiments, the capping patterns 159-1, 159-2 and 159-3 may be disposed on the second auxiliary patterns AXP21, AXP22 and AXP23, respectively. The capping patterns 159-1, 159-2 and 159-3 may include the same material as the capping layer 159 disposed on the second auxiliary electrodes AX21, AX22 and AX23. Each of the capping patterns 159-1, 159-2 and 159-3 may be directly disposed on the second auxiliary patterns AXP21, AXP22 and AXP23, respectively. Since the bank structure 160 includes the tip TIP, the capping patterns 159-1, 159-2 and 159-3 may be marks formed by the material forming the capping layer 159 being disconnected by the (TIP) of the bank structure without being connected to the capping layer 159. In the area overlapping the second openings OP2, with reference to FIG. 6, the second auxiliary electrodes AX21, AX22 and AX23 and the second auxiliary patterns AXP21, AXP22 and AXP23 may respectively be positioned at spaced portions (e.g., areas or regions) between the capping layer 159 and the capping patterns 159-1, 159-2, and 159-3.

Referring to FIG. 9, in the area overlapping the second opening OP2, the first capping pattern 159-1 may include a side surface 159-1c, and the side surface 159-1c of the first capping pattern 159-1 may cover the side surface AXP21c of the second auxiliary pattern AXP21. In the example of FIG. 9, the first capping pattern 159-1 does not cover the lower surface AXP21a of the second auxiliary pattern AXP21. The second capping pattern 159-2 and the third capping pattern 159-3 may include the same structure and characteristics as the first capping pattern 159-1.

In some embodiments, referring back to FIG. 6, the first through third inorganic layers 171-1 through 171-3 may be formed on the bank structure 160 and disposed to cover each emission area EA1 through EA3 or the light emitting elements ED1, ED2 and ED3 in the second openings OP2 of the bank structure 160. The first through third inorganic layers 171-1 through 171-3 may prevent the light emitting elements ED1 through ED3 from being damaged by external air and may prevent the patterns disposed on the bank structure 160 from being peeled off during the fabrication process of the display device 10.

In some embodiments, the first to third inorganic layers 171-1, 171-2 and 171-3 may be formed by chemical vapor deposition, such that the first to third inorganic layers 171-1, 171-2 and 171-3 may be formed to have a uniform thickness along a step difference of the layers that are deposited. For example, the first to third inorganic layers 171-1, 171-2 and 171-3 may form a thin film even below an undercut caused by the tip TIP of the first bank layer 161 and the second bank layer 163.

In the display device 10, the first through third inorganic layers 171-1 through 171-3 may be disposed on the same layer, but may be formed in different processes during the fabrication process of the display device 10. For example, the light emitting elements EL1 through EL3 of the first through third light emitting elements ED1 through ED3 may be formed in different processes such the light emitting elements EL1 through EL3 are not formed simultaneously. In an example embodiment, the first inorganic layer 171-1 may be formed after the first light emitting element ED1 is formed, the second inorganic layer 171-2 may be formed after the second light emitting element ED2 is formed, and the third inorganic layer 171-3 may be formed after the third light emitting element ED3 is formed. That is, for example, the first inorganic layer 171-1 may be formed before the second light emitting element ED2 and the third light emitting element ED3, and the second inorganic layer 171-2 may be formed before the third light emitting element ED3 is formed.

In other words, the shape of the first inorganic layer 171-1 may be formed to completely cover the second emission area EA2 and the third emission area EA3 (e.g., the first inorganic layer 171-1 may be formed such that the shape of the first inorganic layer 171-1 completely covers the second emission area EA2 and the third emission area EA3), and the first inorganic layer 171-1 may be partially or completely removed from the second emission area EA2 and the third emission area EA3 through a dry etch process. In addition, after forming the first inorganic layer 171-1, the second inorganic layer 171-2 may be formed such that the shape of the second inorganic layer 171-2 completely covers the first emission area EA1 and the third emission area EA3 (e.g., the shape of the second inorganic layer 171-2 may be formed to completely cover the first emission area EA1 and the third emission area EA3), and the second inorganic layer 171-2 may be partially or completely removed from the second emission area EA2 and the third emission area EA3 through a dry etch process. Further, after the first inorganic layer 171-1 and the second inorganic layer 171-2 are formed, the third inorganic layer 171-3 may be formed such that the shape of the third inorganic layer 171-3 completely covers the first emission area EA1 and the second emission area EA2 (e.g., the shape of the third inorganic layer 171-3 may be formed to completely cover the first emission area EA1 and the second emission area EA2), and the third inorganic layer 171-3 may be partially or completely removed from the first emission area EA1 and the second emission area EA2 through a dry etch process.

In some embodiments, the second auxiliary electrodes AX21, AX22 and AX23 and the second auxiliary patterns AXP21, AXP22 and AXP23 may protect the bank structure 160 during a dry etching process in which the first to third inorganic layers 171-1, 171-2 and 171-3 are removed. As described herein, the second auxiliary electrodes AX21, AX22 and AX23 may include indium-zinc-oxide (IZO) and include 90 wt % of indium oxide and 10 wt % of zinc oxide. Accordingly, the second auxiliary electrodes AX21, AX22 and AX23 may not be etched in the dry etching process, thereby covering and protecting the bank structure 160.

Figure 10:
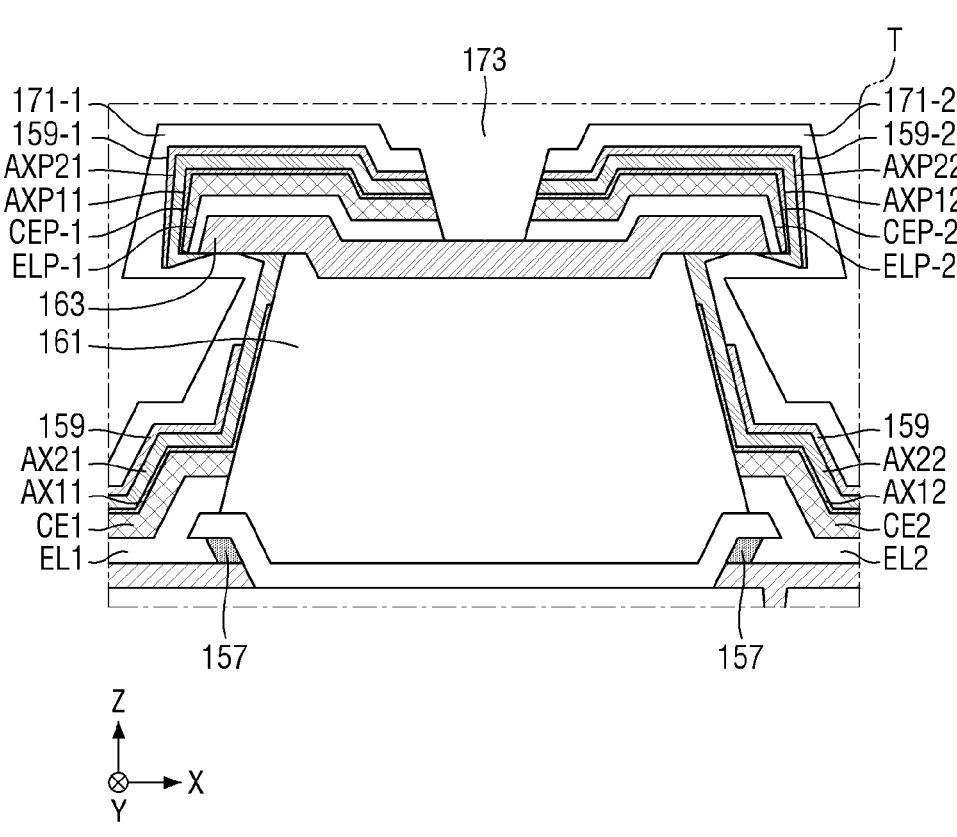
FIG. 10 is an enlarged cross-sectional view of area 'T' of FIG. 6.

FIG. 10 is an enlarged cross-sectional view of area 'T' of FIG. 6.

Referring to FIG. 10, the first inorganic layer 171-1, the lower pattern covered by the first inorganic layer 171-1, the second inorganic layer 171-2, and the lower pattern covered by the second inorganic layer 171-2 formed through different processes may be disposed to be spaced apart from each other on the bank structure 160. Accordingly, for example, a portion of the second bank layer 163 of the bank structure 160 that does not overlap the first inorganic layer 171-1 and the second inorganic layer 171-2 may be exposed. The exposed portion of the second bank layer 163 may be in direct contact with the second encapsulation layer 173 of the thin film encapsulation layer 170.

The relationship between the first inorganic layer 171-1 and the second inorganic layer 171-2 as shown in the drawings is an example. In accordance with one or more embodiments of the present disclosure, the third inorganic layer 171-3 may also be disposed to be spaced apart from the second inorganic layer 171-2, similar to the descriptions provided with reference to first inorganic layer 171-1.

The examples described herein in the present disclosure should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a substrate;
   a first pixel electrode disposed on the substrate;
   a pixel defining layer disposed on the substrate and defining a first opening overlapping the first pixel electrode;
   a bank structure disposed on the pixel defining layer and defining a second opening overlapping the first opening;
   a first light emitting layer disposed on the first pixel electrode and in the first opening;
   a first common electrode disposed on the first light emitting layer and in contact with the bank structure in the second opening;
   a first auxiliary electrode disposed on the first common electrode, completely covering the first common electrode in the second opening, and in contact with the bank structure;

a second auxiliary electrode disposed on the first auxiliary electrode, completely covering the first auxiliary electrode in the second opening, and in contact with the bank structure; and a first encapsulation layer disposed on the second auxiliary electrode and the bank structure, wherein the bank structure comprises:

a first bank layer disposed on the pixel defining layer and including a conductive material; and a second bank layer disposed on the first bank layer and including a tip protruding more than a side surface of the first bank layer toward the first opening, wherein the second auxiliary electrode is in contact with the second bank layer, and wherein the first auxiliary electrode is spaced apart from the second bank layer.

2. The display device of claim 1, wherein the side surface of the first bank layer comprises:

a first portion in contact with the first common electrode;

a second portion in contact with the first auxiliary electrode; and a third portion in contact with the second auxiliary electrode, wherein the second portion is positioned between the first portion and the third portion, and wherein areas of the first portion, the second portion and the third portion are different.

3. The display device of claim 2, wherein the area of the second portion where the first auxiliary electrode is in contact with the side surface of the first bank layer is greater than the area of the first portion where the first common electrode is in contact with the side surface of the first bank layer.

4. The display device of claim 3, wherein the area of the second portion where the first auxiliary electrode is in contact with the side surface of the first bank layer is greater than the area of the third portion where the second auxiliary electrode is in contact with the side surface of the first bank layer.

5. The display device of claim 1, further comprising a capping layer completely covering the second auxiliary electrode in the first opening, wherein the capping layer exposes a portion of the second auxiliary electrode in the second opening.

6. The display device of claim 5, wherein an exposed portion of the second auxiliary electrode not covered by the capping layer in the second opening is in contact with the first encapsulation layer.

7. The display device of claim 1, wherein the thickness of the first auxiliary electrode in the direction perpendicular to the first direction is smaller than the thickness of the second auxiliary electrode.

8. The display device of claim 1, wherein the first auxiliary electrode includes silver alloy, and wherein the second auxiliary electrode includes a transparent conductive oxide.

9. The display device of claim 8, wherein the first auxiliary electrode further includes palladium and copper.

10. The display device of claim 1, wherein a thickness of the first auxiliary electrode in a direction perpendicular to a first direction is 30 Å or more and 50 Å or less.

11. The display device of claim 1, wherein a thickness of the second auxiliary electrode in a direction perpendicular to a first direction is 500 Å or more and 700 Å or less.

12. The display device of claim 1, further comprising:

a first organic pattern disposed on the second bank layer of the bank structure and surrounding the first opening, wherein the first organic pattern includes a same material as the first light emitting layer; and a first electrode pattern disposed on the first organic pattern and surrounding the first opening, wherein the first electrode pattern includes a same material as the first common electrode, wherein the first organic pattern overlaps the protruding tip of the second bank layer and is spaced apart from the first light emitting layer, and wherein the first electrode pattern overlaps the protruding tip of the second bank layer and is spaced apart from the first common electrode.

13. The display device of claim 12, further comprising:

a first auxiliary pattern disposed on the first electrode pattern and surrounding the first opening, wherein the first auxiliary pattern includes a same material as the first auxiliary electrode; and a second auxiliary pattern disposed on the first auxiliary pattern and surrounding the first opening, wherein the second auxiliary pattern includes a same material as the second auxiliary electrode, wherein the first auxiliary pattern overlaps the protruding tip of the second bank layer and is spaced apart from the first auxiliary electrode, and wherein the second auxiliary pattern overlaps the protruding tip of the second bank layer and is spaced apart from the second auxiliary electrode.

14. The display device of claim 13, wherein the second bank layer further comprises a first surface facing the first bank layer, wherein the second auxiliary electrode and the second auxiliary pattern are in contact with the first surface of the second bank layer, and wherein the second auxiliary electrode and the second auxiliary pattern in contact with the first surface of the second bank layer are spaced apart from each other.

15. The display device of claim 14, wherein the second bank layer and the first encapsulation layer are in contact with each other at a region between the second auxiliary pattern and the second auxiliary electrode on the first surface of the second bank layer.

16. The display device of claim 14, further comprising a capping pattern disposed in an area overlapping the second opening, wherein the capping pattern at least partially covers the second auxiliary pattern, wherein the capping pattern at least partially exposes the second auxiliary pattern in the area overlapping the second opening, and wherein a portion of the second auxiliary pattern partially exposed by the capping pattern is in contact with the first encapsulation layer.

17. The display device of claim 1, further comprising:

a second pixel electrode spaced apart from the first pixel electrode, wherein the pixel defining layer is interposed between the first pixel electrode and the second pixel electrode;

a second light emitting layer disposed on the second pixel electrode;

a second common electrode disposed on the second light emitting layer;

a third auxiliary electrode disposed on the second common electrode; and a fourth auxiliary electrode disposed on the third auxiliary electrode, wherein the first encapsulation layer further comprises:

a first inorganic layer covering the second auxiliary electrode; and a second inorganic layer covering the fourth auxiliary electrode, wherein the first inorganic layer and the second inorganic layer are disposed to be spaced apart from each other.

18. The display device of claim 17, further comprising a second encapsulation layer disposed on the first encapsulation layer, wherein, in a region where the first inorganic layer and the second inorganic layer included in the first encapsulation layer are spaced apart, the second encapsulation layer and the second bank layer of the bank structure are in contact with each other.

19. A display device comprising:

a substrate;

a first pixel electrode disposed on the substrate;

a pixel defining layer disposed on the substrate and defining a first opening overlapping the first pixel electrode;

a bank structure disposed on the pixel defining layer and defining a second opening overlapping the first opening;

a first light emitting layer disposed on the first pixel electrode and in the first opening;

a first common electrode disposed on the first light emitting layer and in contact with the bank structure in the second opening;

a first auxiliary electrode disposed on the first common electrode, completely covering the first common electrode in the second opening, and in contact with the bank structure;

a second auxiliary electrode disposed on the first auxiliary electrode, completely covering the first auxiliary electrode in the second opening, and in contact with the bank structure;

a first electrode pattern disposed on the bank structure, wherein the first electrode pattern surrounds the first opening and is spaced apart from the first common electrode;

a first auxiliary pattern completely covering the first electrode pattern and spaced apart from the first auxiliary electrode in an area overlapping the second opening;

a second auxiliary pattern completely covering the first auxiliary pattern and spaced apart from the second auxiliary electrode in the area overlapping the second opening; and an encapsulation layer completely covering the second auxiliary electrode and the second auxiliary pattern in the area overlapping the second opening, wherein the bank structure comprises:

a first bank layer disposed on the pixel defining layer and including a conductive material; and a second bank layer disposed on the first bank layer and including a tip where a side surface of the second bank layer protrudes more than a side surface of the first bank layer toward the first opening, wherein the second auxiliary pattern comprises:

a first surface overlapping the second opening and covering the side surface of the second bank layer; and a second surface covering a surface of the second bank layer facing the first bank layer.

20. The display device of claim 19, wherein the second auxiliary electrode extends to a boundary surface where the first bank layer and the second bank layer are in contact with each other, wherein the second auxiliary pattern further includes a third surface in contact with the surface of the second bank layer facing the first bank layer, and wherein the second surface of the second auxiliary pattern covering the surface of the second bank layer and the third surface of the second auxiliary electrode in contact with the surface of the second bank layer are spaced apart from each other.

* * * * *